United States Patent
Tomita

(10) Patent No.: US 7,808,850 B2
(45) Date of Patent: Oct. 5, 2010

(54) SEMICONDUCTOR DEVICE AND SYSTEM

(75) Inventor: Hiroyoshi Tomita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 165 days.

(21) Appl. No.: 12/255,322

(22) Filed: Oct. 21, 2008

(65) Prior Publication Data

US 2009/0040852 A1    Feb. 12, 2009

Related U.S. Application Data

(63) Continuation of application No. PCT/JP2006/308891, filed on Apr. 27, 2006.

(51) Int. Cl.
*G11C 29/00* (2006.01)

(52) U.S. Cl. ............. 365/201; 365/189.15; 365/189.16; 365/189.17; 365/189.07

(58) Field of Classification Search ................. 365/201, 365/189.15, 189.16, 189.17, 189.07
See application file for complete search history.

(56) References Cited

U.S. PATENT DOCUMENTS

| | | | |
|---|---|---|---|
| 6,823,485 B1 * | 11/2004 | Muranaka | 714/719 |
| 7,230,861 B2 * | 6/2007 | Inoue | 365/189.12 |
| 2003/0210069 A1 * | 11/2003 | Kikuchi et al. | 324/765 |
| 2007/0208526 A1 * | 9/2007 | Staudt et al. | 702/117 |

FOREIGN PATENT DOCUMENTS

| | | |
|---|---|---|
| JP | 3-3200 A | 1/1991 |
| JP | 2002-082714 A | 3/2002 |
| JP | 2002-358798 A | 12/2002 |
| JP | 2004-021833 A | 1/2004 |
| JP | 2004-251730 A | 9/2004 |

* cited by examiner

*Primary Examiner*—Hoai V Ho
*Assistant Examiner*—Fernando N Hidalgo
(74) *Attorney, Agent, or Firm*—Arent Fox LLP

(57) ABSTRACT

First and second data output circuits obtain corresponding parts of read data of a storage circuit to output to first and second input/output pads in a second test mode. First and second data input circuits obtain output data of the first and second data output circuits via the first and second input/output pads to output in the second test mode. A comparison object selection circuit selects output data of the first and second data input circuits to output in the second test mode. A judging circuit performs a test judgment by comparing output data of the comparison object selection circuit with expected value data and outputs a test result signal in the second test mode.

18 Claims, 18 Drawing Sheets

SEMICONDUCTOR DEVICE AND SYSTEM

CROSS-REFERENCE TO RELATED APPLICATION

This application is a Continuation Application of International Application No. PCT/JP2006/308891, filed Apr. 27, 2006, designating the U.S., the entire contents of which are incorporated herein by reference.

BACKGROUND

1. Field

The present embodiment relates to a semiconductor device and a system using a semiconductor device.

2. Description of the Related Art

There has been developed a memory LSI having a data compression test function built therein which combines data in the inside of the memory LSI and performs a read/write test.

A test technique for a semiconductor device is disclosed in, for example, Japanese Laid-open Patent Publication No. 2004-251730, Japanese Laid-open Patent Publication No. 2004-21833, and Japanese Laid-open Patent Publication No. 2002-82714. In Japanese Laid-open Patent Publication No. 2004-251730, there is disclosed a technique of enhancing a self-test function performed by a BIST (Built-In Self Test) circuit and realizing a reduction in a chip size or a reduction in the number of external pins in the semiconductor device. In Japanese Laid-open Patent Publication No. 2004-21833, there is disclosed a technique of realizing a reduction in a test cost by enabling to perform a self test on a peripheral function block in the semiconductor device. In Japanese Laid-open Patent Publication No. 2002-82714, there is disclosed a self-diagnosing circuit of an input/output circuit system capable of rapidly and easily detecting a spot where an electrical defect is generated.

SUMMARY

According to one aspect of the embodiment, a semiconductor device to be mounted in a system includes a storage circuit, a self-test circuit, a first data output circuit, a first data input circuit, a second data output circuit, a second data input circuit, a comparison object selection circuit, a judging circuit and a test result output circuit. The storage circuit performs data reading or data writing according to an external control signal in a normal mode, and performs data reading or data writing according to an internal control signal in a first test mode and a second test mode. The self-test circuit generates the internal control signal, test data to be used as write data of the storage circuit and expected value data to be compared with read data of the storage circuit in the first test mode and the second test mode. The first data output circuit obtains a corresponding part of the read data of the storage circuit and outputs the corresponding part of the read data to a first input/output pad in the normal mode and the second test mode. The first data input circuit obtains a corresponding part of the write data of the storage circuit via the first input/output pad in the normal mode, and obtains output data of the first data output circuit via the first input/output pad in the second test mode. The second data output circuit obtains a corresponding part of the read data of the storage circuit and outputs the corresponding part of the read data to a second input/output pad in the normal mode and the second test mode. The second data input circuit obtains a corresponding part of the write data of the storage circuit via the second input/output pad in the normal mode, and obtains output data of the second data output circuit via the second input/output pad in the second test mode. The comparison object selection circuit selects the read data of the storage circuit in the first test mode, and selects data including output data of the first data input circuit and output data of the second data input circuit in the second test mode. The judging circuit performs a test judgment by comparing output data of the comparison object selection circuit with the expected value data and outputs a test result signal in the first test mode and the second test mode. The test result output circuit obtains the test result signal and outputs the test result signal to an output pad in the first test mode and the second test mode.

DETAILED DESCRIPTION OF THE EMBODIMENTS

In the read/write test using the self-test function, external pins to input control signals and external pins to input/output data are not used, so that operation tests with respect to input circuits and output circuits of these external pins are not conducted. Further, in the read/write test using the data compression test function, a part of external pins to input/output data is not used, so that operation tests with respect to input circuits and output circuits of these external pins are not conducted. As above, in the read/write test using the self-test function or the data compression test function, there is a case that the operation tests with respect to the input circuits and the output circuits of the external pins cannot be sufficiently conducted, resulting that a test coverage is lowered.

Figure 1:
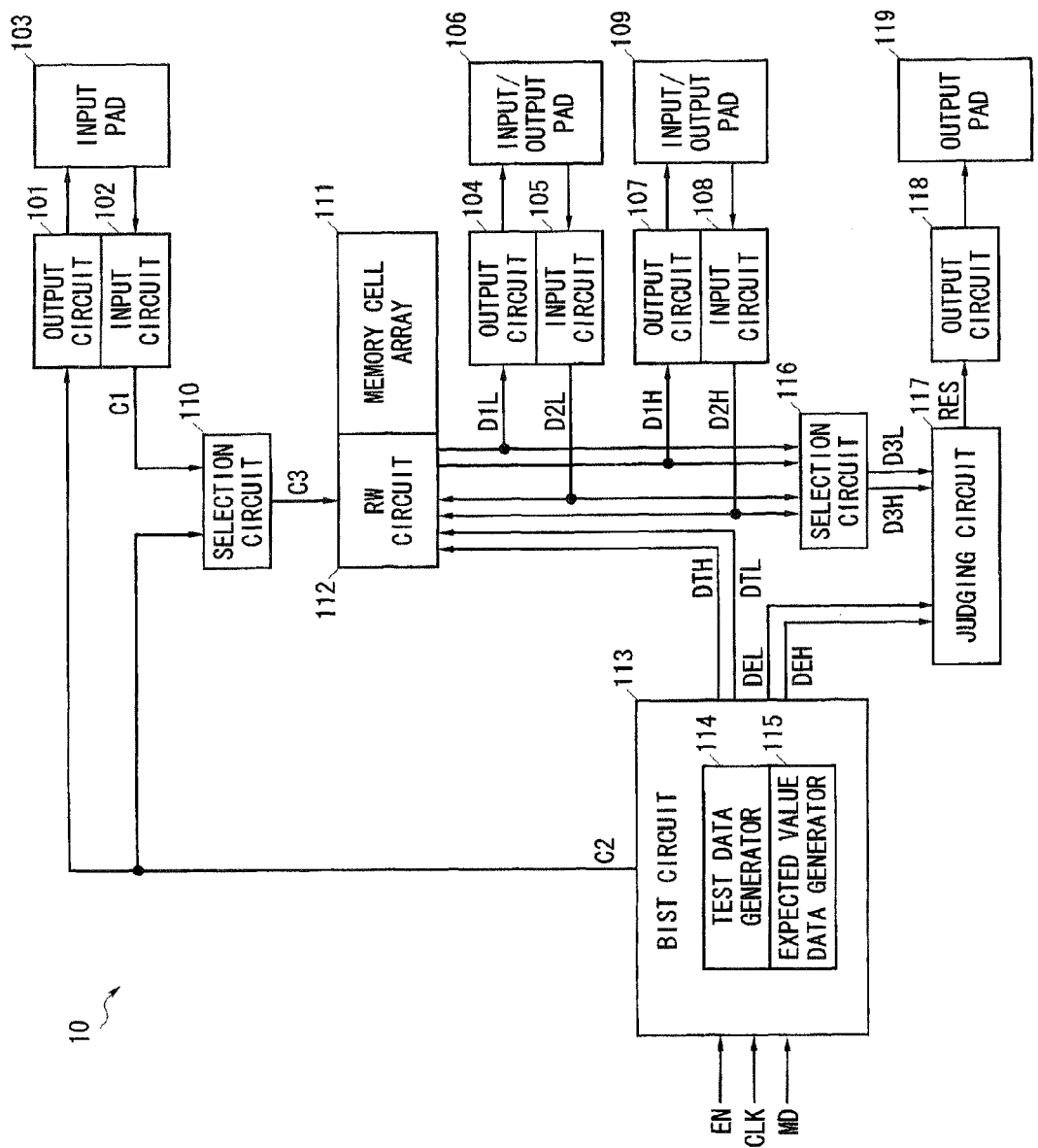
FIG. 1 illustrates a first embodiment.

FIG. 1 illustrates a first embodiment. A semiconductor device 10 of the first embodiment is formed as, for instance, a DRAM (Dynamic Random Access Memory), and includes an output circuit 101, an input circuit 102, an input pad 103, an output circuit 104, an input circuit 105, an input/output pad 106, an output circuit 107, an input circuit 108, an input/output pad 109, a selection circuit 110, a memory cell array 111, an RW circuit (read/write circuit) 112, a BIST circuit 113, a selection circuit 116, a judging circuit 117, an output circuit 118 and an output pad 119.

Note that a mode signal MD is supplied only to the BIST circuit 113 in FIG. 1, but actually, it is also supplied to the other circuits. The mode signal MD is a signal which indicates an operation mode (any of a normal mode, a first test mode or a second test mode) of the semiconductor device 10. The mode signal MD may be supplied from a mode register used for setting the operation mode of the semiconductor device 10, or supplied via an external pin.

When the mode signal MD indicates the second test mode, the output circuit 101 obtains a control signal C2 supplied from the BIST circuit 113 and outputs to the input pad 103. A drivability of the output circuit 101 is set to be smaller than those of the output circuits 104, 107 and 118, and set at a magnitude to the extent of not affecting a spec of the input pad 103. When the mode signal MD indicates the normal mode, the input circuit 102 obtains a control signal supplied from an exterior via the input pad 103 and outputs as a control signal C1. When the mode signal MD indicates the second test mode, the input circuit 102 obtains a control signal supplied from the output circuit 101 via the input pad 103 and outputs as the control signal C1.

When the mode signal MD indicates either of the normal mode or the second test mode, in accordance with a read access operation of the RW circuit 112, the output circuit 104 obtains data D1L supplied from the RW circuit 112 and outputs to the input/output pad 106. When the mode signal MD indicates the normal mode, in accordance with a write access operation of the RW circuit 112, the input circuit 105 obtains a low-order bit of write data of the memory cell array 111 supplied from the exterior via the input/output pad 106 and outputs as data D2L. When the mode signal MD indicates the second test mode, in accordance with the read access operation of the RW circuit 112, the input circuit 105 obtains data supplied from the output circuit 104 via the input/output pad 106 and outputs as the data D2L.

When the mode signal MD indicates either of the normal mode or the second test mode, in accordance with the read access operation of the RW circuit 112, the output circuit 107 obtains data D1H supplied from the RW circuit 112 and outputs to the input/output pad 109. When the mode signal MD indicates the normal mode, in accordance with the write access operation of the RW circuit 112, the input circuit 108 obtains a high-order bit of the write data of the memory cell array 111 supplied from the exterior via the input/output pad 109 and outputs as data D2H. When the mode signal MD indicates the second test mode, in accordance with the read access operation of the RW circuit 112, the input circuit 108 obtains data supplied from the output circuit 107 via the input/output pad 109 and outputs as the data D2H.

When the mode signal MD indicates either of the normal mode or the second test mode, the selection circuit 110 selects the control signal C1 supplied from the input circuit 102 and outputs as a control signal C3. When the mode signal MD indicates the first test mode, the selection circuit 110 selects the control signal C2 supplied from the BIST circuit 113 and outputs as the control signal C3. The memory cell array 111 is formed by disposing a plurality of dynamic memory cells in a matrix shape.

The RW circuit 112 performs the read access operation/write access operation with respect to the memory cell array 111 based on the control signal C3 supplied from the selection circuit 110. The control signal C3 supplied from the selection circuit 110 (the control signal C1 supplied from the input circuit 102 and the control signal C2 supplied from the BIST circuit 113) include(s) an address signal indicating memory cells being objects to be accessed, a command signal indicating the read access operation/write access operation, and a clock signal to be a reference of an operation timing of the read access operation/write access operation. The RW circuit 112 outputs data read from the memory cell array 111 by the read access operation as the data D1L and D1H. When the mode signal MD indicates the normal mode, the RW circuit 112 performs the write access operation using the data D2L and D2H supplied from the input circuits 105 and 108. When the mode signal MD indicates either of the first test mode or the second test mode, the RW circuit 112 performs the write access operation using test data DTL and DTH supplied from the BIST circuit 113.

The BIST circuit 113 includes a test data generator 114 and an expected value data generator 115. When the mode signal MD indicates the first test mode, in synchronization with a clock signal CLK after an activation of an enable signal EN, the BIST circuit 113 repeatedly sets a command indicated by the command signal of the control signal C2 at a write command while sequentially changing an address indicated by the address signal of the control signal C2, and sequentially outputs the test data DTL and DTH generated by the test data generator 114. Subsequently, in synchronization with the clock signal CLK, the BIST circuit 113 repeatedly sets a command indicated by the command signal at a read command while sequentially changing an address indicated by the address signal, and sequentially outputs expected value data DEL and DEH generated by the expected value data generator 115.

When the mode signal MD indicates the second test mode, in synchronization with the clock signal CLK after the activation of the enable signal EN, the BIST circuit 113 sets an address indicated by the address signal of the control signal C2 at a predetermined address, sets a command indicated by the command signal of the control signal C2 at a write command, and outputs predetermined test data DTL and DTH. Subsequently, in synchronization with the clock signal CLK, the BIST circuit 113 sets an address indicated by the address signal at a predetermined address, sets a command indicated by the command signal at a read command, and outputs predetermined expected value data DEL and DEH. Note that the BIST circuit 113 outputs the clock signal of the control signal C2 in synchronization with the clock signal CLK.

When the mode signal MD indicates the first test mode, in accordance with the read access operation of the RW circuit 112, the selection circuit 116 selects the data D1L and D1H supplied from the RW circuit 112 and outputs as data D3L and D3H. When the mode signal MD indicates the second test mode, in accordance with the read access operation of the RW circuit 112, the selection circuit 116 selects the data D2L and D2H supplied from the input circuits 105 and 108 and outputs as the data D3L and D3H.

When the mode signal MD indicates either of the first test mode or the second test mode, in accordance with the read access operation of the RW circuit 112, the judging circuit 117 executes a pass/fail judgment by comparing the expected value data DEL and DEH supplied from the BIST circuit 113 with the data D3L and D3H supplied from the selection circuit 116, and outputs a test result signal RES. When the mode signal MD indicates either of the first test mode or the second test mode, in accordance with the read access operation of the RW circuit 112, the output circuit 118 obtains the test result signal RES supplied from the judging circuit 117 and outputs to the output pad 119.

Figure 2:
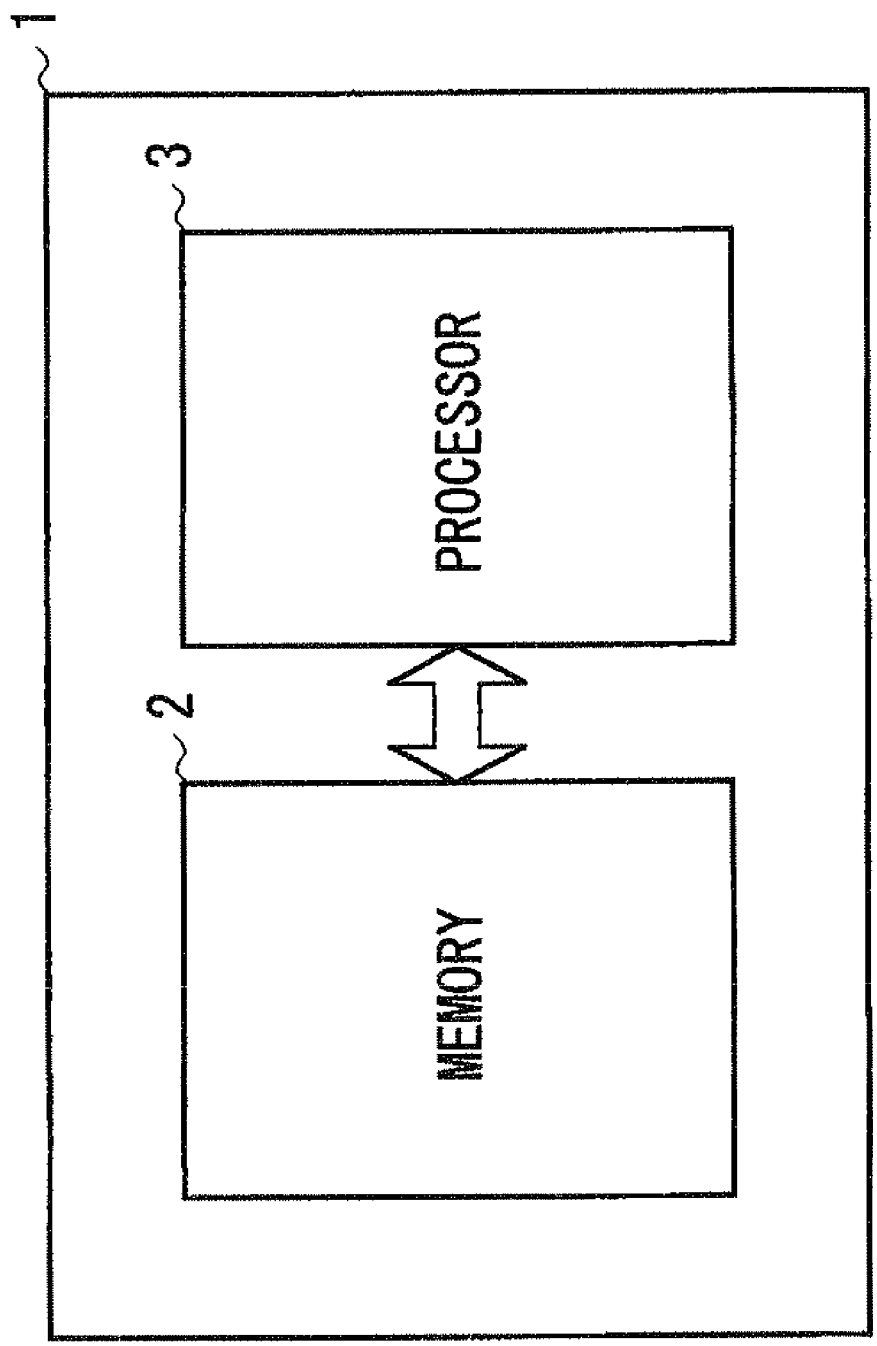
FIG. 2 illustrates an example of a system LSI.

FIG. 2 illustrates an example of a system LSI. A system LSI 1 is configured by mutually coupling a memory 2 and a processor 3 formed respectively on two of the semiconductor chips to be housed in a same package. For instance, the semiconductor device 10 illustrated in FIG. 1 embodies the memory 2 of the system LSI 1. The system LSI 1 is configured by using a technique such as an MCP (Multi Chip Package) and an SiP (System in Package).

Figure 3:
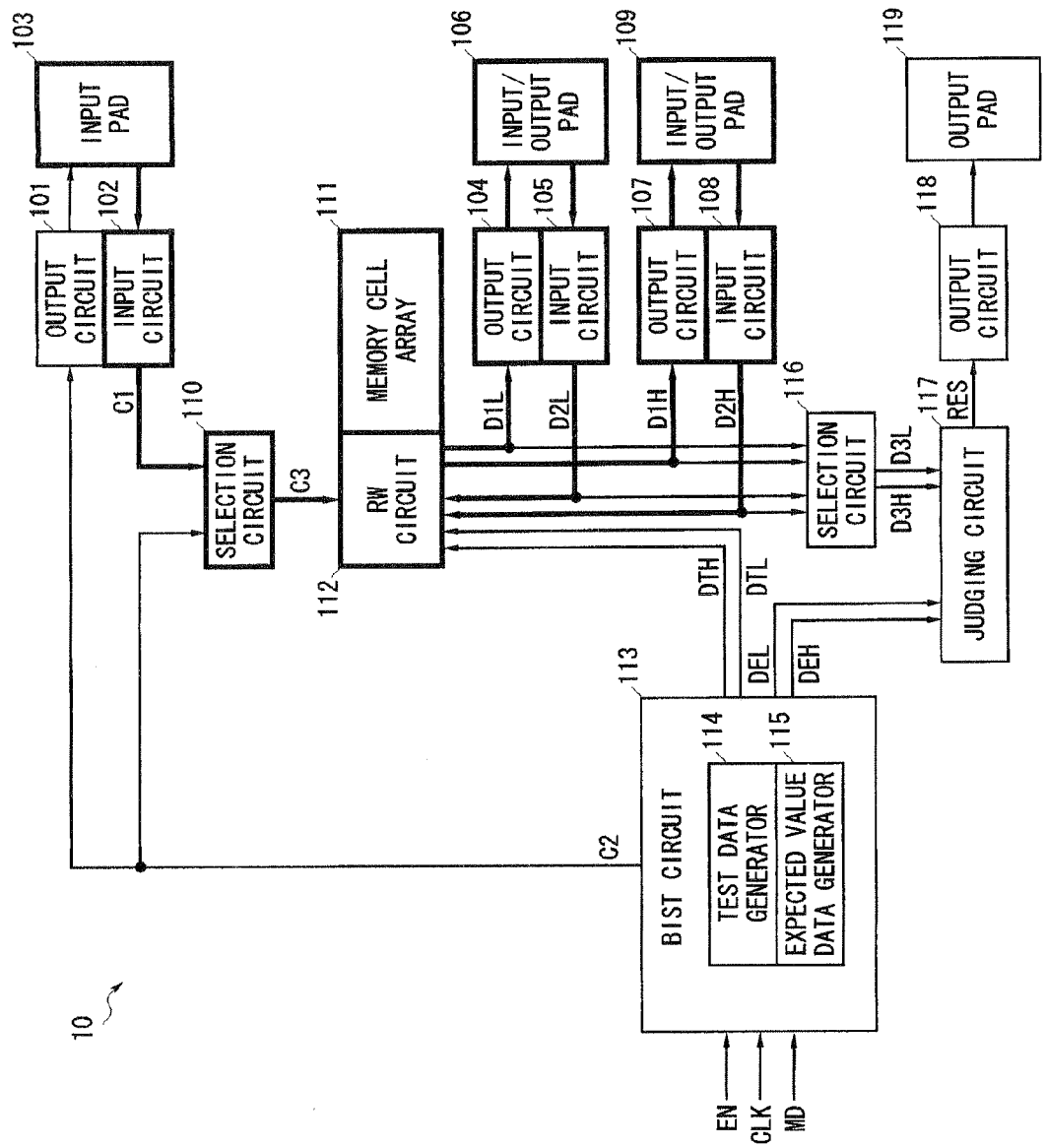
FIG. 3 illustrates an operation in a normal mode in a semiconductor device of FIG. 1.

FIG. 3 illustrates an operation in the normal mode in the semiconductor device of FIG. 1. When the mode signal MD indicates the normal mode, signal paths illustrated by bold lines in FIG. 3 are effective in the semiconductor device 10. When the mode signal MD indicates the normal mode, the control signal supplied from the exterior to the input pad 103 is supplied to the RW circuit 112 via the input circuit 102 and the selection circuit 110. The write data of the memory cell array 111 supplied from the exterior to the input/output pads 106 and 109 are supplied to the RW circuit 112 via the input circuits 105 and 108. The read data of the memory cell array 111 supplied from the RW circuit 112 are supplied to the input/output pads 106 and 109 via the output circuits 104 and 107.

Figure 4:
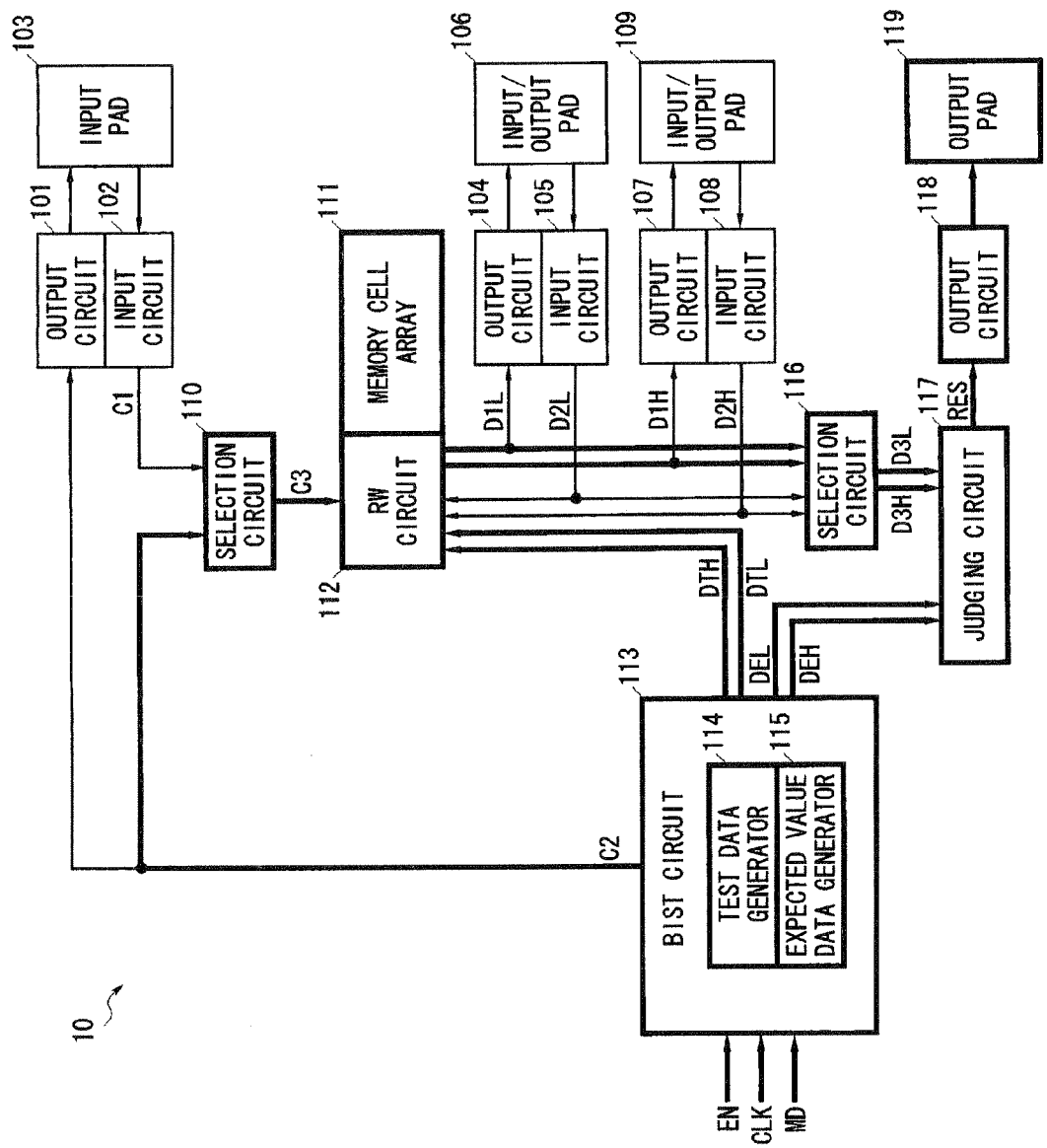
FIG. 4 illustrates an operation in a first test mode in the semiconductor device of FIG. 1.

FIG. 4 illustrates an operation in the first test mode in the semiconductor device of FIG. 1. When the mode signal MD indicates the first test mode, signal paths illustrated by bold lines in FIG. 4 are effective in the semiconductor device 10. When the mode signal MD indicates the first test mode, the control signal C2 supplied from the BIST circuit 113 is supplied to the RW circuit 112 via the selection circuit 110. The test data DTL and DTH supplied from the BIST circuit 113 are supplied to the RW circuit 112 as the write data of the memory cell array 111. The read data of the memory cell array 111 supplied from the RW circuit 112 are supplied to the judging circuit 117 via the selection circuit 116. The expected value data DEL and DEH supplied from the BIST circuit 113 are supplied to the judging circuit 117. The test result signal RES supplied from the judging circuit 117 is supplied to the output pad 119 via the output circuit 118.

Figure 5:
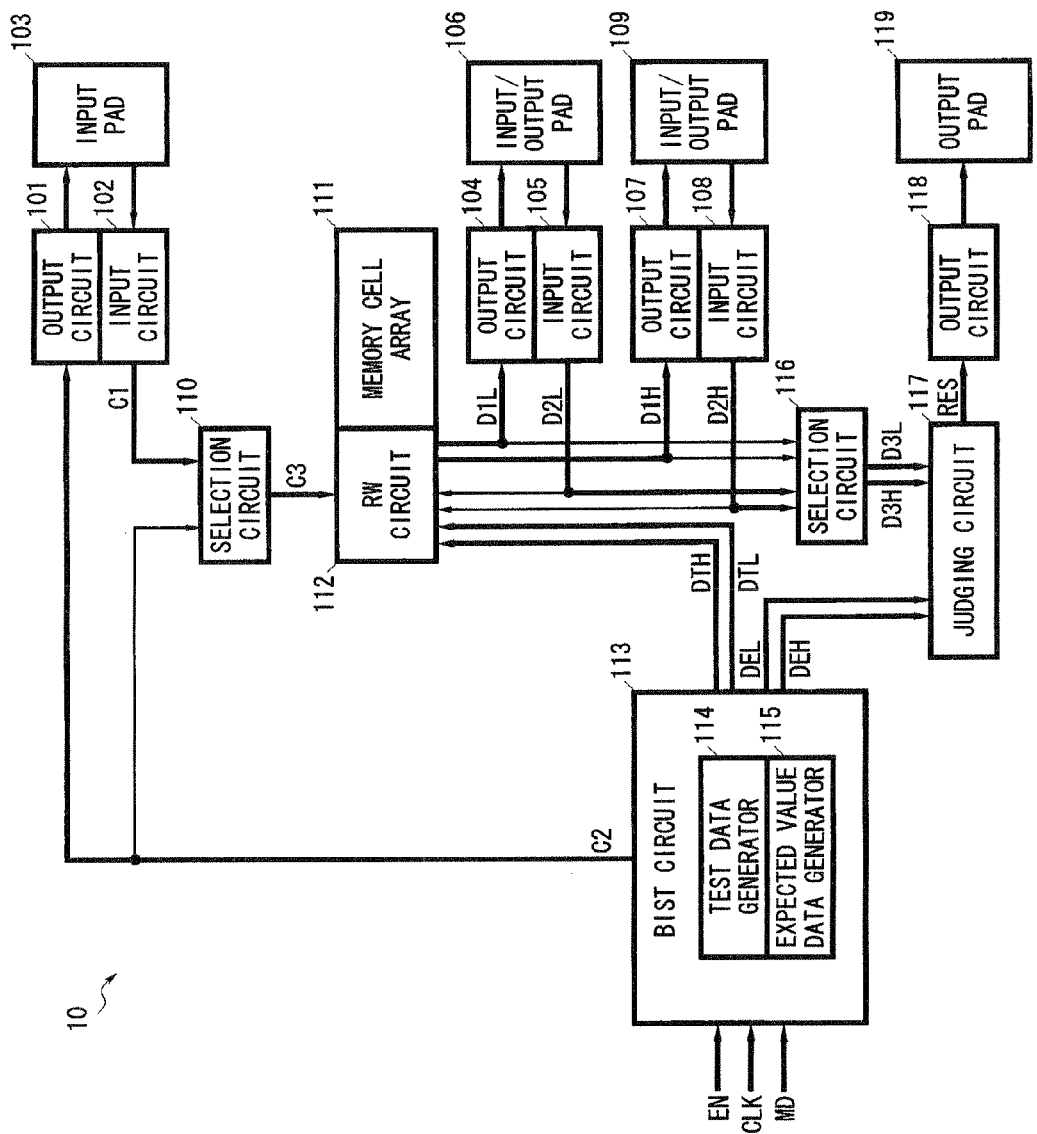
FIG. 5 illustrates an operation in a second test mode in the semiconductor device of FIG. 1.

FIG. 5 illustrates an operation in the second test mode in the semiconductor device of FIG. 1. When the mode signal MD indicates the second test mode, signal paths illustrated by bold lines in FIG. 5 are effective in the semiconductor device 10. When the mode signal MD indicates the second test mode, the control signal C2 supplied from the BIST circuit 113 is supplied to the RW circuit 112 via the output circuit 101, the input circuit 102 and the selection circuit 110. The test data DTL and DTH supplied from the BIST circuit 113 are supplied to the RW circuit 112 as the write data of the memory cell array 111. The read data of the memory cell array 111 supplied from the RW circuit 112 are supplied to the judging circuit 117 via the output circuits 104 and 107, the input circuits 105 and 108 and the selection circuit 116. The expected value data DEL and DEH supplied from the BIST circuit 113 are supplied to the judging circuit 117. The test result signal RES supplied from the judging circuit 117 is supplied to the output pad 119 via the output circuit 118.

Figure 6:
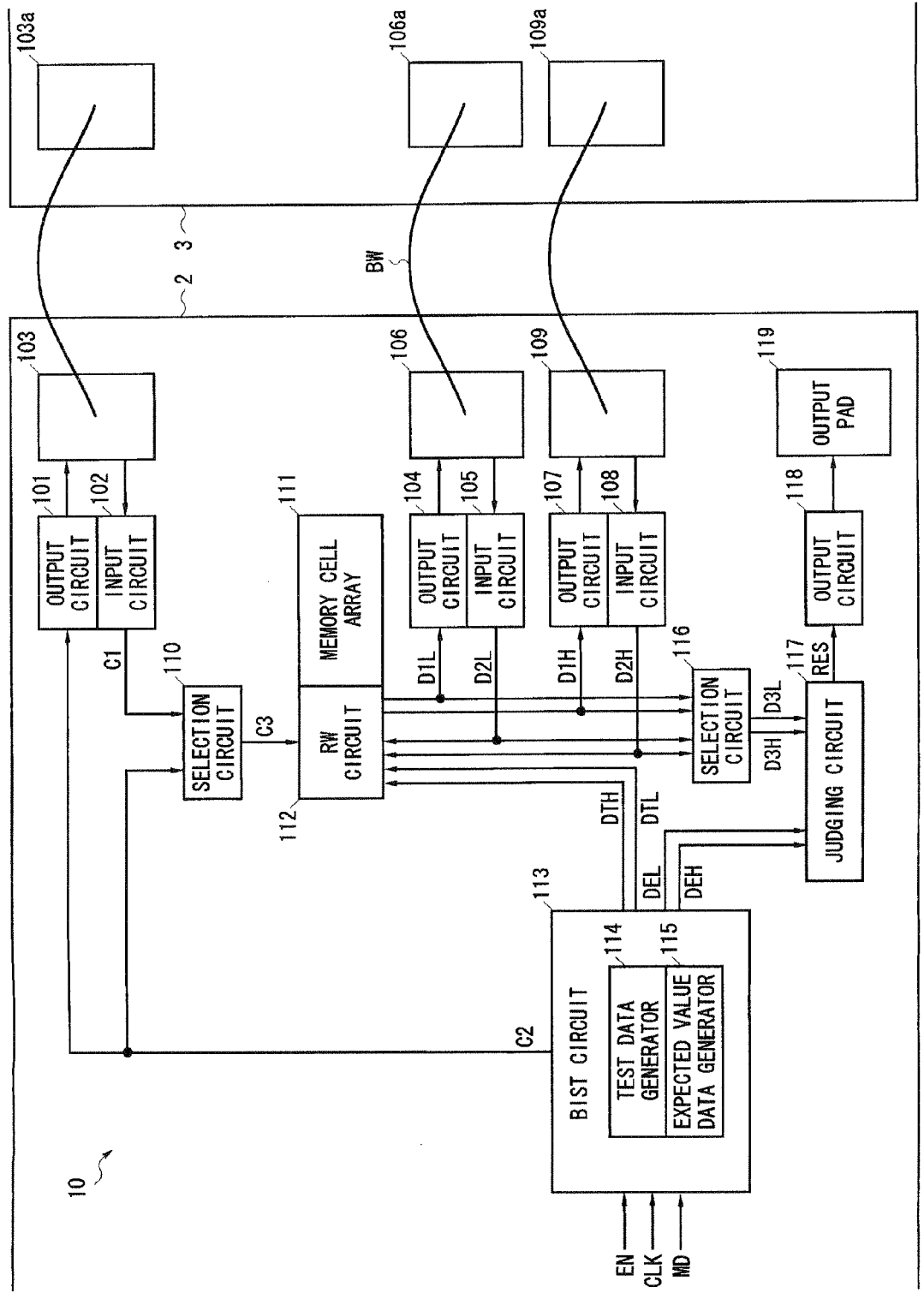
FIG. 6 illustrates an outline of an inter-chip connection test in a system LSI of FIG. 2.

FIG. 6 illustrates an outline of an inter-chip connection test in the system LSI of FIG. 2. When the memory 2 (semiconductor device 10) is operated in the second test mode in a shipping test of the system LSI 1 illustrated in FIG. 2, if a short exists among bonding wires BW respectively coupling pads 103, 106 and 109 in the memory 2 and pads 103a, 106a and 109a in the processor 3, a fail judgment is made. Accordingly, a self test in the second test mode of the memory 2 (semiconductor device 10) can be applied to the inter-chip connection test of the system LSI 1. Note that in the system LSI 1, the pads 103, 106 and 109 in the memory 2 are coupled only to the pads 103a, 106a and 109a in the processor 3 without being coupled to external pins of the package.

In the first embodiment as described above, when the mode signal MD indicates the second test mode, the control signal C2 supplied from the BIST circuit 113 is supplied to the RW circuit 112 via the output circuit 101, the input circuit 102 and the selection circuit 110. Further, when the mode signal MD indicates the second test mode, the read data of the memory cell array 111 supplied from the RW circuit 112 are supplied to the judging circuit 117 via the output circuits 104 and 107, the input circuits 105 and 108 and the selection circuit 116. Therefore, by the self test in the second test mode, operation tests with respect to the input circuit 102, the output circuits 104 and 107, and the input circuits 105 and 108 can be conducted, As above, it is possible to easily enhance a test coverage of the semiconductor device 10 by utilizing a self-test function.

Figure 7:
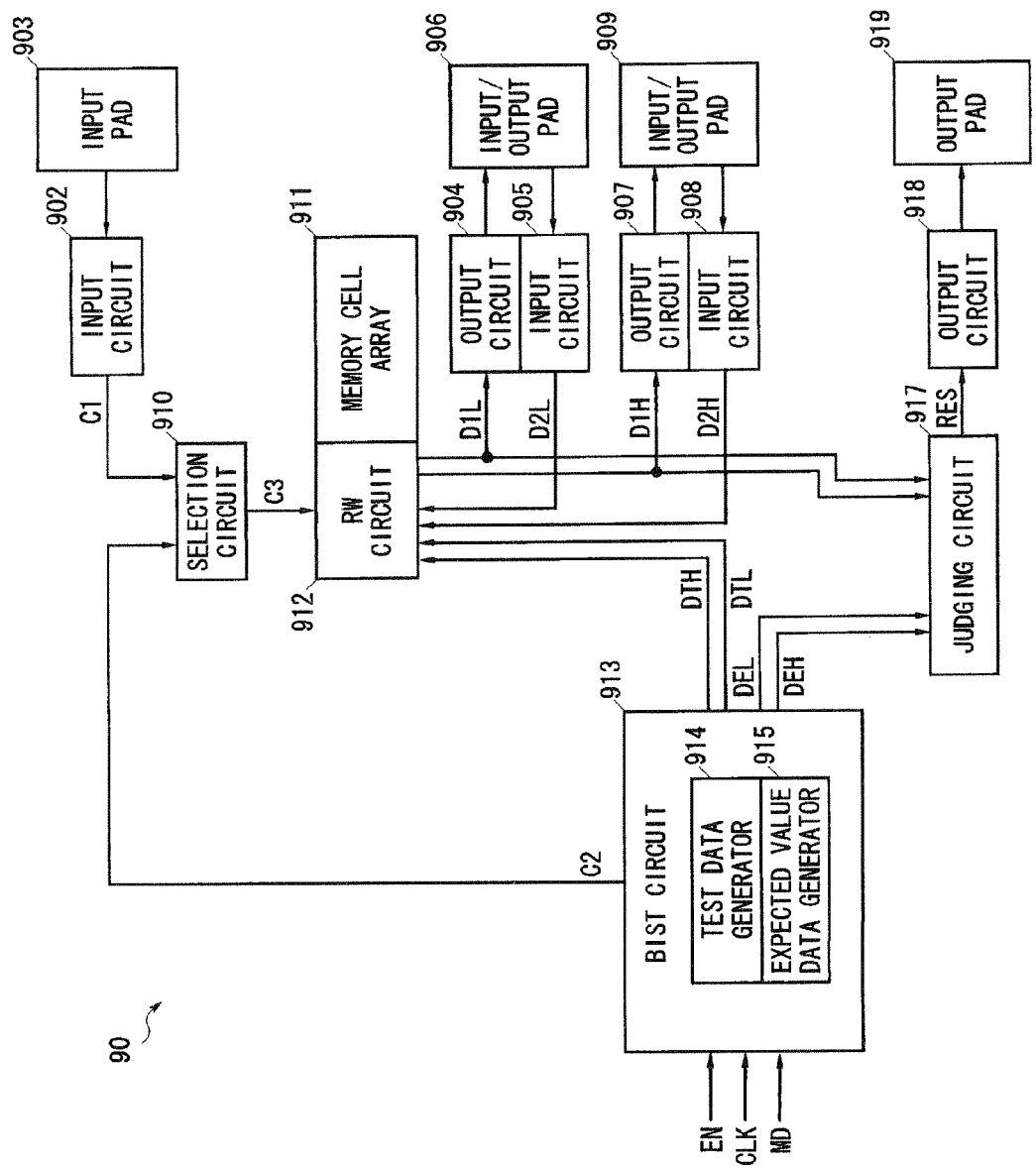
FIG. 7 illustrates a first comparative example.

FIG. 7 illustrates a first comparative example. A semiconductor device 90 of the first comparative example is formed as, for example, a DRAM, and includes an input circuit 902, an input pad 903, an output circuit 904, an input circuit 905, an input/output pad 906, an output circuit 907, an input circuit 908, an input/output pad 909, a selection circuit 910, a memory cell array 911, an RW circuit 912, a BIST circuit 913, a judging circuit 917, an output circuit 918 and an output pad 919.

Note that a mode signal MD is supplied only to the BIST circuit 913 in FIG. 7, but actually, it is also supplied to the other circuits. The mode signal MD is a signal which indicates an operation mode (either of a normal mode or a test mode) of the semiconductor device 90. For instance, the mode signal MD is supplied from a mode register used for setting the operation mode of the semiconductor device 90.

The input circuit 902 obtains a control signal supplied from the exterior via the input pad 903 and outputs as a control signal C1. When the mode signal MD indicates the normal mode, in accordance with a read access operation of the RW circuit 912, the output circuit 904 obtains data D1L supplied from the RW circuit 912 and outputs to the input/output pad 906. When the mode signal MD indicates the normal mode, in accordance with a write access operation of the RW circuit 912, the input circuit 905 obtains a low-order bit of write data of the memory cell array 911 supplied from the exterior via the input/output pad 906 and outputs as data D2L.

When the mode signal MD indicates the normal mode, in accordance with the read access operation of the RW circuit 912, the output circuit 907 obtains data D1H supplied from the RW circuit 912 and outputs to the input/output pad 909. When the mode signal MD indicates the normal mode, in accordance with the write access operation of the RW circuit 912, the input circuit 908 obtains a high-order bit of the write data of the memory cell array 911 supplied from the exterior via the input/output pad 909 and outputs as data D2H.

When the mode signal MD indicates the normal mode, the selection circuit 910 selects the control signal C1 supplied from the input circuit 902 and outputs as a control signal C3. When the mode signal MD indicates the test mode, the selection circuit 910 selects the control signal C2 supplied from the BIST circuit 913 and outputs as the control signal C3. The memory cell array 911 is formed by disposing a plurality of dynamic memory cells in a matrix shape.

The RW circuit 912 performs the read access operation/write access operation with respect to the memory cell array 911 based on the control signal C3 supplied from the selection circuit 910. The control signal C3 supplied from the selection circuit 910 (the control signal C1 supplied from the input circuit 902 and the control signal C2 supplied from the BIST circuit 913) include(s) an address signal indicating memory cells being objects to be accessed, a command signal indicating the read access operation/write access operation, and a clock signal to be a reference of an operation timing of the read access operation/write access operation. The RW circuit 912 outputs data read from the memory cell array 911 by the read access operation as the data D1L and D1H. When the mode signal MD indicates the normal mode, the RW circuit 912 performs the write access operation using the data D2L and D2H supplied from the input circuits 905 and 908. When the mode signal MD indicates the test mode, the RW circuit 912 performs the write access operation using the test data DTL and DTH supplied from the BIST circuit 913.

The BIST circuit 913 includes a test data generator 914 and an expected value data generator 915. When the mode signal MD indicates the test mode, in synchronization with a clock signal CLK after an activation of an enable signal EN, the BIST circuit 913 repeatedly sets a command indicated by the command signal of the control signal C2 at a write command while sequentially changing an address indicated by the address signal of the control signal C2, and sequentially outputs the test data DTL and DTH generated by the test data generator 914. Subsequently, in synchronization with the clock signal CLK, the BIST circuit 913 repeatedly sets a command indicated by the command signal at a read command while sequentially changing an address indicated by the address signal, and sequentially outputs expected value data DEL and DEH generated by the expected value data generator 915. Note that the BIST circuit 913 outputs the clock signal of the control signal C2 in synchronization with the clock signal CLK.

When the mode signal MD indicates the test mode, in accordance with the read access operation of the RW circuit 912, the judging circuit 917 executes a pass/fail judgment by comparing the expected value data DEL and DEH supplied from the BIST circuit 913 with the data D1L and D1H supplied from the RW circuit 912, and outputs a test result signal RES. When the mode signal MD indicates the test mode, in accordance with the read access operation of the RW circuit 912, the output circuit 918 obtains the test result signal RES supplied from the judging circuit 917 and outputs to the output pad 919.

In the first comparative example as described above, operation tests with respect to the input circuit 902, the output circuits 904 and 907, and the input circuits 905 and 908 cannot be conducted by a self test in the test mode, which results in lowering a test coverage of the semiconductor device 90.

Figure 8:
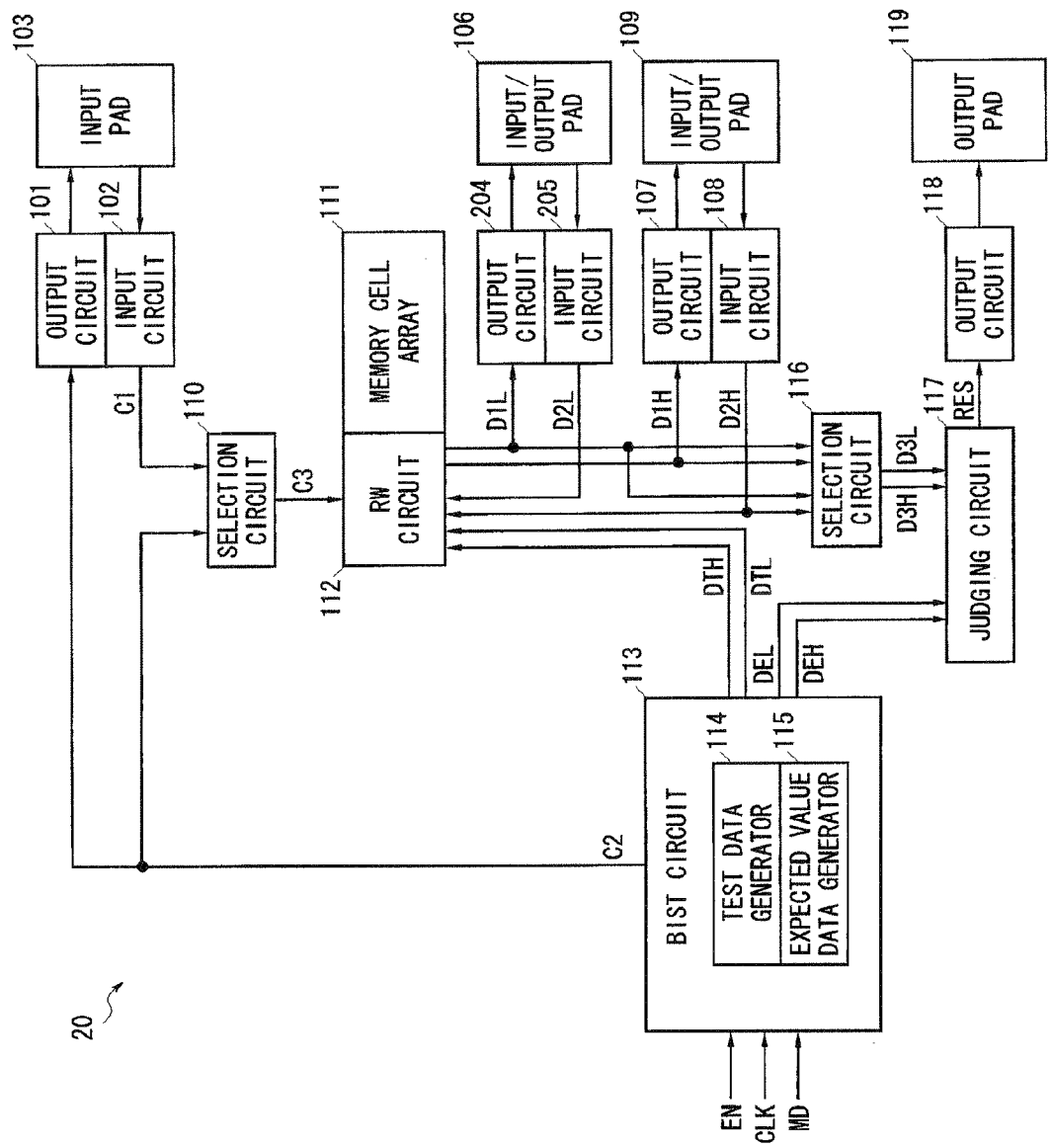
FIG. 8 illustrates a second embodiment.

FIG. 8 illustrates a second embodiment. In explaining the second embodiment, the same elements as those explained in the first embodiment are denoted by the same reference numerals, and detailed explanations of that will be omitted. A semiconductor device 20 of the second embodiment is the same as the semiconductor device 10 of the first embodiment except that it includes an output circuit 204 and an input circuit 205 instead of the output circuit 104 and the input circuit 105, and the selection circuit 116 receives the data D1L instead of the data D2L. For instance, the semiconductor device 20 of the second embodiment embodies the memory 2 of the system LSI 1 illustrated in FIG. 2, similarly as the semiconductor device 10 of the first embodiment.

When the mode signal MD indicates a normal mode, in accordance with a read access operation of the RW circuit 112, the output circuit 204 obtains the data D1L supplied from the RW circuit 112 and outputs to the input/output pad 106. When the mode signal MD indicates the normal mode, in accordance with a write access operation of the RW circuit 112, the input circuit 205 obtains a low-order bit of write data of the memory cell array 111 supplied from the exterior via the input/output pad 106 and outputs as the data D2L.

When the input/output pad 106 is used in a wafer test of the semiconductor device 20 (when a test is conducted by bringing a probe into contact with the input/output pad 106), it means that operation tests are conducted with respect to the output circuit 204 and the input circuit 205, so that the output circuit 204 and the input circuit 205 can be excluded from test objects of a self test in the second test mode. Accordingly, in the semiconductor device 20, when the mode signal MD indicates the second test mode, the data to be compared with the expected value data DEL and DEH supplied from the BIST circuit 113 by the judging circuit 117 are set to be the data D1L supplied from the RW circuit 112 and the data D2H supplied from the input circuit 108 so that only the operation tests with respect to the output circuit 107 and the input circuit 108 can be conducted by the self test in the second test mode. As described above, also in the second embodiment, it is possible to easily improve a test coverage of the semiconductor device 20 by utilizing a self-test function, similarly as in the first embodiment. Further, if the output circuit 204 and the input circuit 205 are the test objects of the self test in the second test mode, when the self test in the second test mode is executed, there is required a time regarding the input/output pad 106 to charge and discharge a capacitor between the probe and a tester, which becomes a main cause for increasing a test time. Accordingly, by excluding the output circuit 204 and the input circuit 205 from the test objects of the self test in the second test mode, it is possible to reduce the test time.

Figure 9:
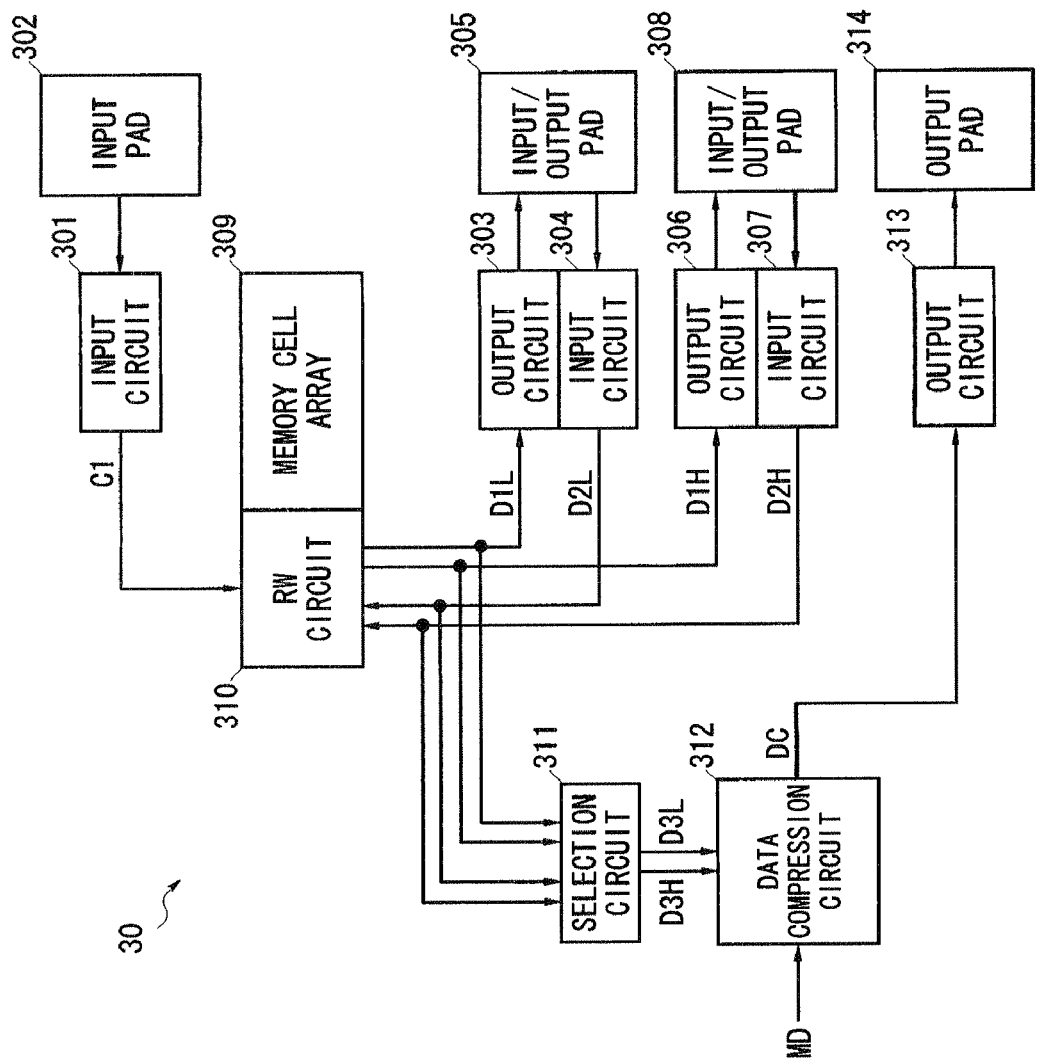
FIG. 9 illustrates a third embodiment.

FIG. 9 illustrates a third embodiment. A semiconductor device 30 of the third embodiment is formed as, for example, a DRAM, and includes an input circuit 301, an input pad 302, an output circuit 303, an input circuit 304, an input/output pad 305, an output circuit 306, an input circuit 307, an input/output pad 308, a memory cell array 309, an RW circuit 310, a selection circuit 311, a data compression circuit 312, an output circuit 313 and an output pad 314. For example, the semiconductor device 30 of the third embodiment embodies the memory 2 of the LSI 1 illustrated in FIG. 2, similarly as the semiconductor device 10 of the first embodiment.

Note that a mode signal MD is supplied only to the data compression circuit 312 in FIG. 9, but actually, it is also supplied to the other circuits. The mode signal MD is a signal which indicates an operation mode (any of a normal mode, a first test mode or a second test mode) of the semiconductor device 30. The mode signal MD may be supplied from a mode register used for setting the operation mode of the semiconductor device 30, or supplied via an external pin.

The input circuit 301 obtains a control signal supplied from the exterior via the input pad 302 and outputs as a control signal C1. When the mode signal MD indicates either of the normal mode or the second test mode, in accordance with a read access operation of the RW circuit 310, the output circuit 303 obtains data D1L supplied from the RW circuit 310 and outputs to the input/output pad 305. When the mode signal MD indicates the normal mode, in accordance with a write access operation of the RW circuit 310, the input circuit 304 obtains a low-order bit of write data of the memory cell array 309 supplied from the exterior via the input/output pad 305 and outputs as data D2L. When the mode signal MD indicates either of the first test mode or the second test mode, in accordance with the write access operation of the RW circuit 310, the input circuit 304 obtains compressed data corresponding to the write data of the memory cell array 309 supplied from the exterior via the input/output pad 305 and outputs as the data D2L. When the mode signal MD indicates the second test mode, in accordance with the read access operation of the RW circuit 310, the input circuit 304 obtains data supplied from the output circuit 303 via the input/output pad 305 and outputs as the data D2L.

When the mode signal MD indicates either of the normal mode or the second test mode, in accordance with the read access operation of the RW circuit 310, the output circuit 306 obtains data D1H supplied from the RW circuit 310 and outputs to the input/output pad 308. When the mode signal MD indicates the normal mode, in accordance with the write access operation of the RW circuit 310, the input circuit 307 obtains a high-order bit of the write data of the memory cell array 309 supplied from the exterior via the input/output pad 308 and outputs as data D2H. When the mode signal MD indicates the second test mode, in accordance with the read access operation of the RW circuit 310, the input circuit 307 obtains data supplied from the output circuit 306 via the input/output pad 308 and outputs as the data D2H.

The memory cell array 309 is formed by disposing a plurality of dynamic memory cells in a matrix shape. The RW circuit 310 performs the read access operation/write access operation with respect to the memory cell array 309 based on the control signal C1 supplied from the input circuit 301. The control signal C1 supplied from the input circuit 301 includes an address signal indicating memory cells being objects to be accessed, a command signal indicating the read access operation/write access operation, and a clock signal to be a reference of an operation timing of the read access operation/write access operation. The RW circuit 310 outputs data read from the memory cell array 309 by the read access operation as the data D1L and D1H. When the mode signal MD indicates the normal mode, the RW circuit 310 performs the write access operation using the data D2L and D2H supplied from the input circuits 304 and 307. When the mode signal MD indicates either of the first test mode or the second test mode, the RW circuit 310 performs the write access operation using write data generated based on the data D2L supplied from the input circuit 304.

When the mode signal MD indicates the first test mode, in accordance with the read access operation of the RW circuit 310, the selection circuit 311 selects the data D1L and D1H supplied from the RW circuit 310 and outputs as data D3L and D3H. When the mode signal MD indicates the second test mode, in accordance with the read access operation of the RW circuit 310, the selection circuit 311 selects the data D2L and D2H supplied from the input circuits 304 and 307 and outputs as the data D3L and D3H.

When the mode signal MD indicates either of the first test mode or the second test mode, in accordance with the read access operation of the RW circuit 310, the data compression circuit 312 compresses the data D3L and D3H supplied from the selection circuit 311 and outputs as compressed data DC. When the mode signal MD indicates either of the first test mode or the second test mode, in accordance with the read access operation of the RW circuit 310, the output circuit 313 obtains the compressed data DC supplied from the data compression circuit 312 and outputs to the output pad 314.

Figure 10:
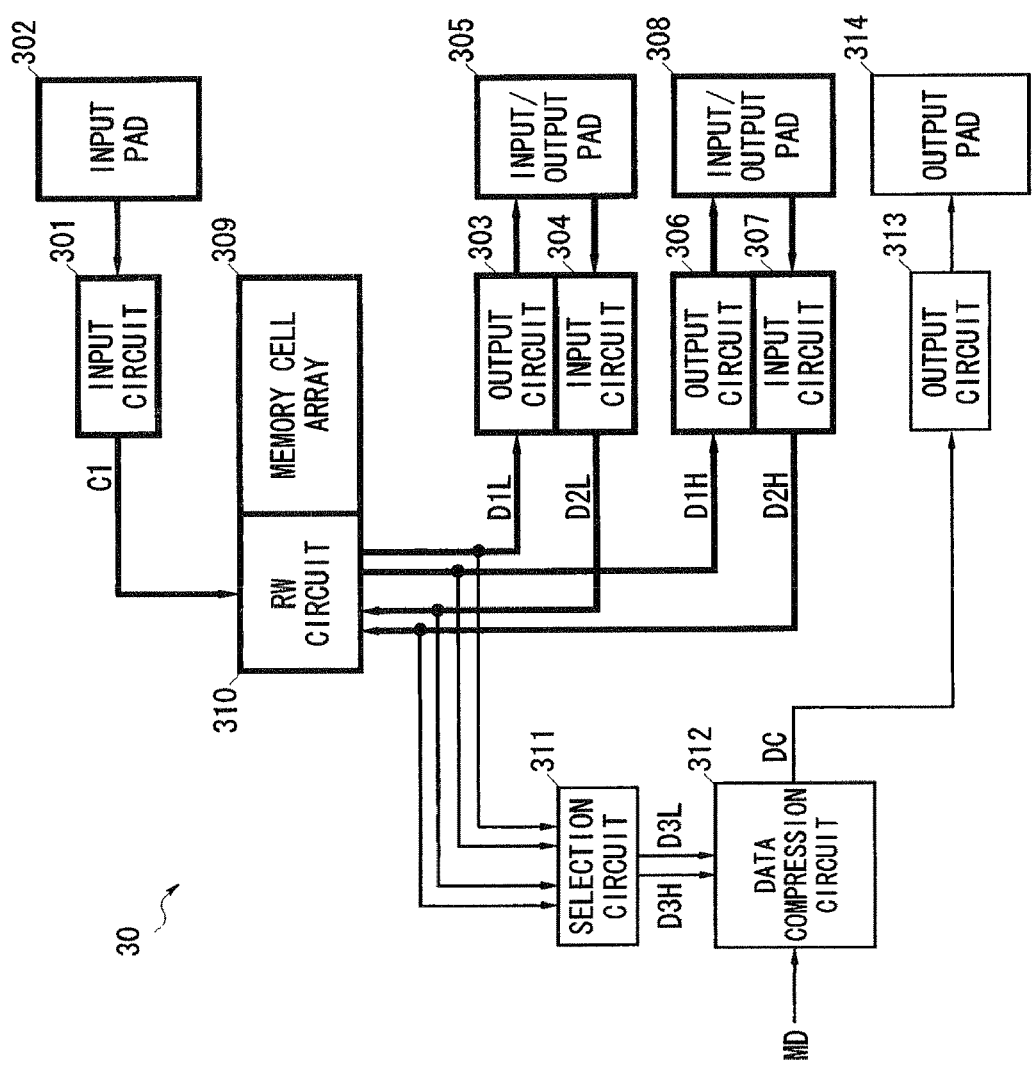
FIG. 10 illustrates an operation in a normal mode in a semiconductor device of FIG. 9.

FIG. 10 illustrates an operation in the normal mode in the semiconductor device of FIG. 9. When the mode signal MD indicates the normal mode, signal paths illustrated by bold lines in FIG. 10 are effective in the semiconductor device 30. When the mode signal MD indicates the normal mode, the control signal supplied from the exterior to the input pad 302 is supplied to the RW circuit 310 via the input circuit 301. The write data of the memory cell array 309 supplied from the exterior to the input/output pads 305 and 308 are supplied to the RW circuit 310 via the input circuits 304 and 307. The read data of the memory cell array 309 supplied from the RW circuit 310 are supplied to the input/output pads 305 and 308 via the output circuits 303 and 306.

Figure 11:
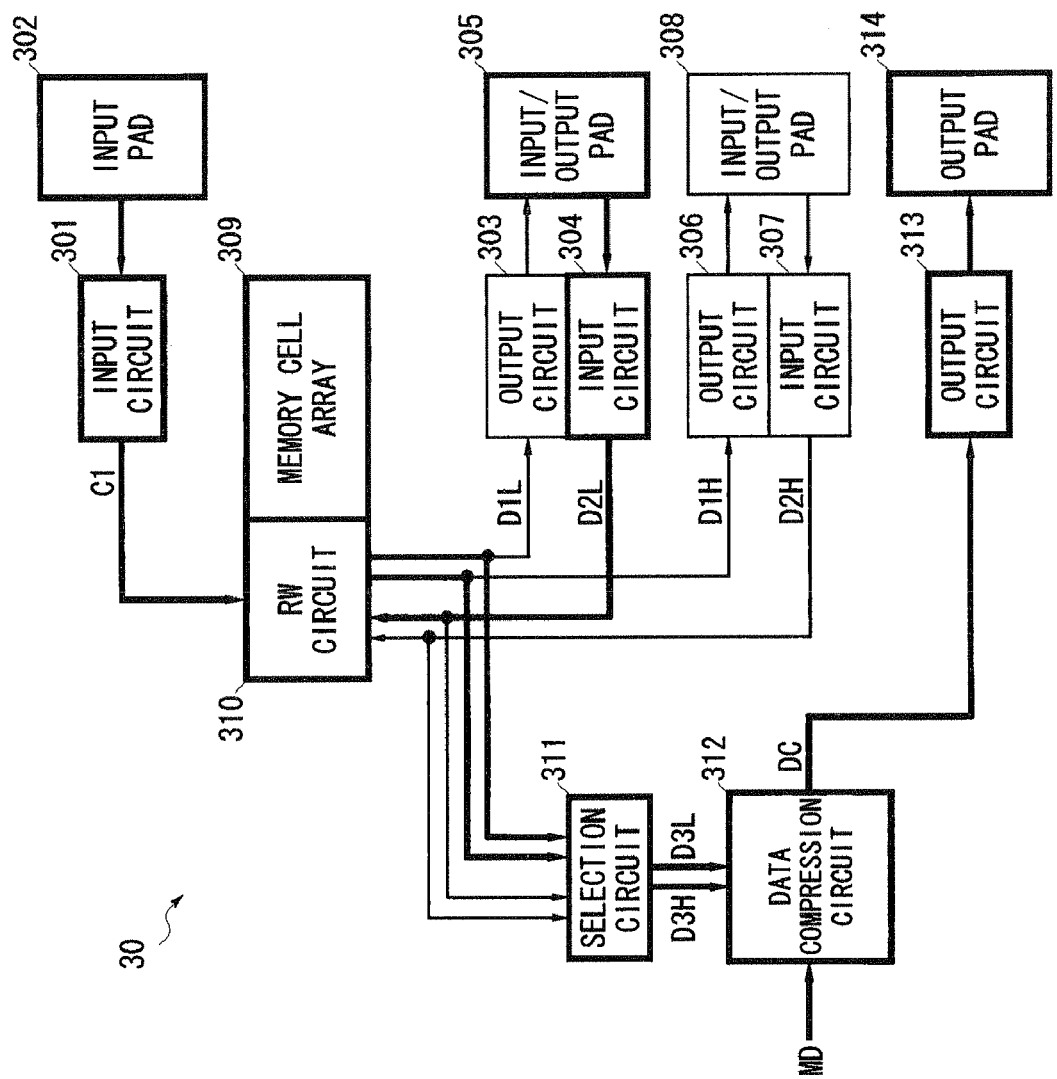
FIG. 11 illustrates an operation in a first test mode in the semiconductor device of FIG. 9.

FIG. 11 illustrates an operation in the first test mode in the semiconductor device of FIG. 9. When the mode signal MD indicates the first test mode, signal paths illustrated by bold lines in FIG. 11 are effective in the semiconductor device 30. When the mode signal MD indicates the first test mode, the control signal supplied from the exterior to the input pad 302 is supplied to the RW circuit 310 via the input circuit 301. The compressed data corresponding to the write data of the memory cell array 309 supplied from the exterior to the input/output pad 305 are supplied to the RW circuit 310 via the input circuit 304. The read data of the memory cell array 309 supplied from the RW circuit 310 are supplied to the data compression circuit 312 via the selection circuit 311. The compressed data DC supplied from the data compression circuit 312 are supplied to the output pad 314 via the output circuit 313.

Figure 12:
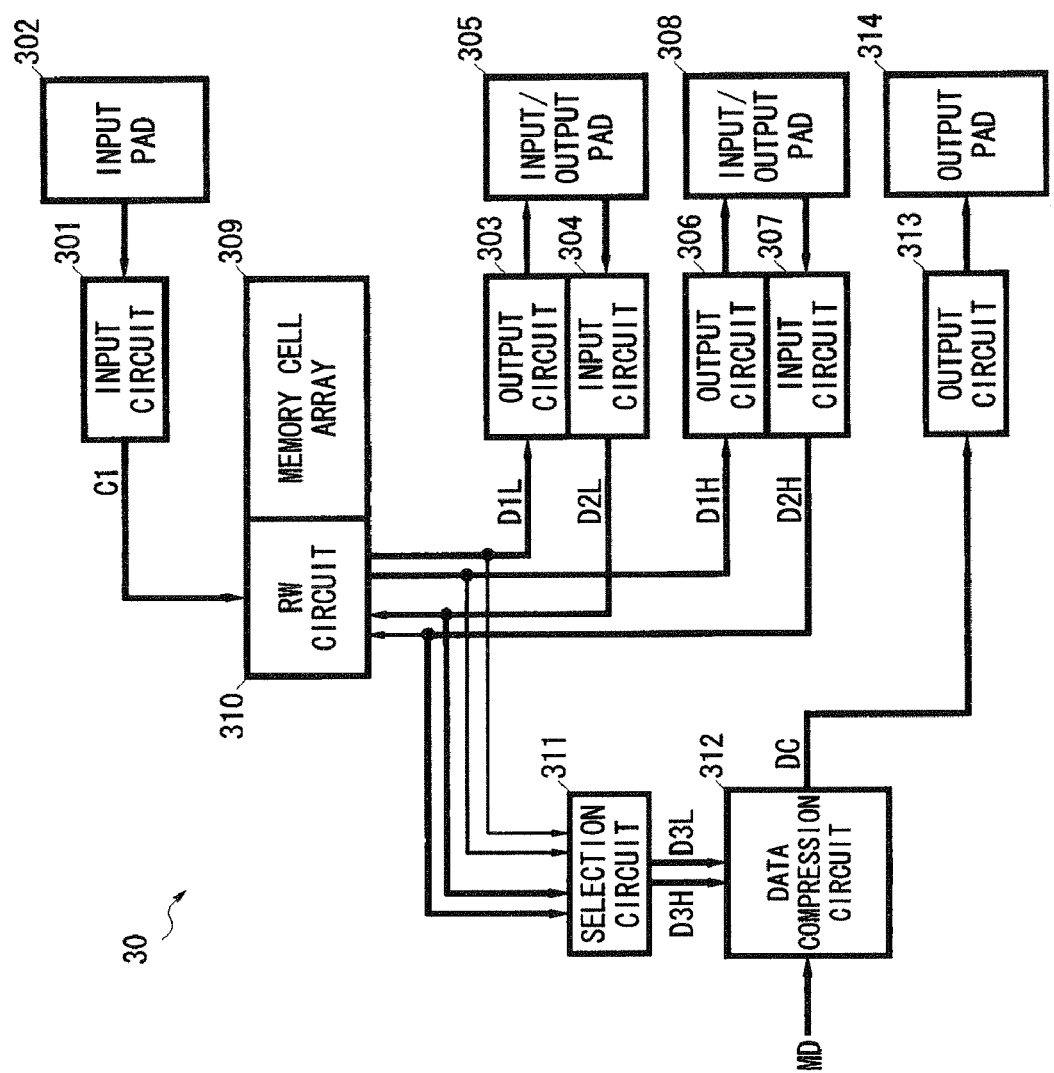
FIG. 12 illustrates an operation in a second test mode in the semiconductor device of FIG. 9.

FIG. 12 illustrates an operation in the second test mode in the semiconductor device of FIG. 9. When the mode signal MD indicates the second test mode, signal paths illustrated by bold lines in FIG. 12 are effective in the semiconductor device 30. When the mode signal MD indicates the second test mode, the control signal supplied from the exterior to the input pad 302 is supplied to the RW circuit 310 via the input circuit 301. The compressed data corresponding of the write data of the memory cell array 309 supplied from the exterior to the input/output pad 305 are supplied to the RW circuit 310 via the input circuit 304. The read data of the memory cell array 309 supplied from the RW circuit 310 are supplied to the data compression circuit 312 via the output circuits 303 and 306, the input circuits 304 and 307 and the selection circuit 311. The compressed data DC supplied from the data compression circuit 312 are supplied to the output pad 314 via the output circuit 313.

In the third embodiment as described above, when the mode signal MD indicates the second test mode, the read data of the memory cell array 309 supplied from the RW circuit 310 are supplied to the data compression circuit 312 via the output circuits 303 and 306, the input circuits 304 and 307 and the selection circuit 311. Therefore, by a data compression test in the second test mode, operation tests with respect to the output circuits 303 and 306 and the input circuits 304 and 307 can be conducted. As above, it is possible to easily enhance a test coverage of the semiconductor device 30 by utilizing a data compression test function.

Figure 13:
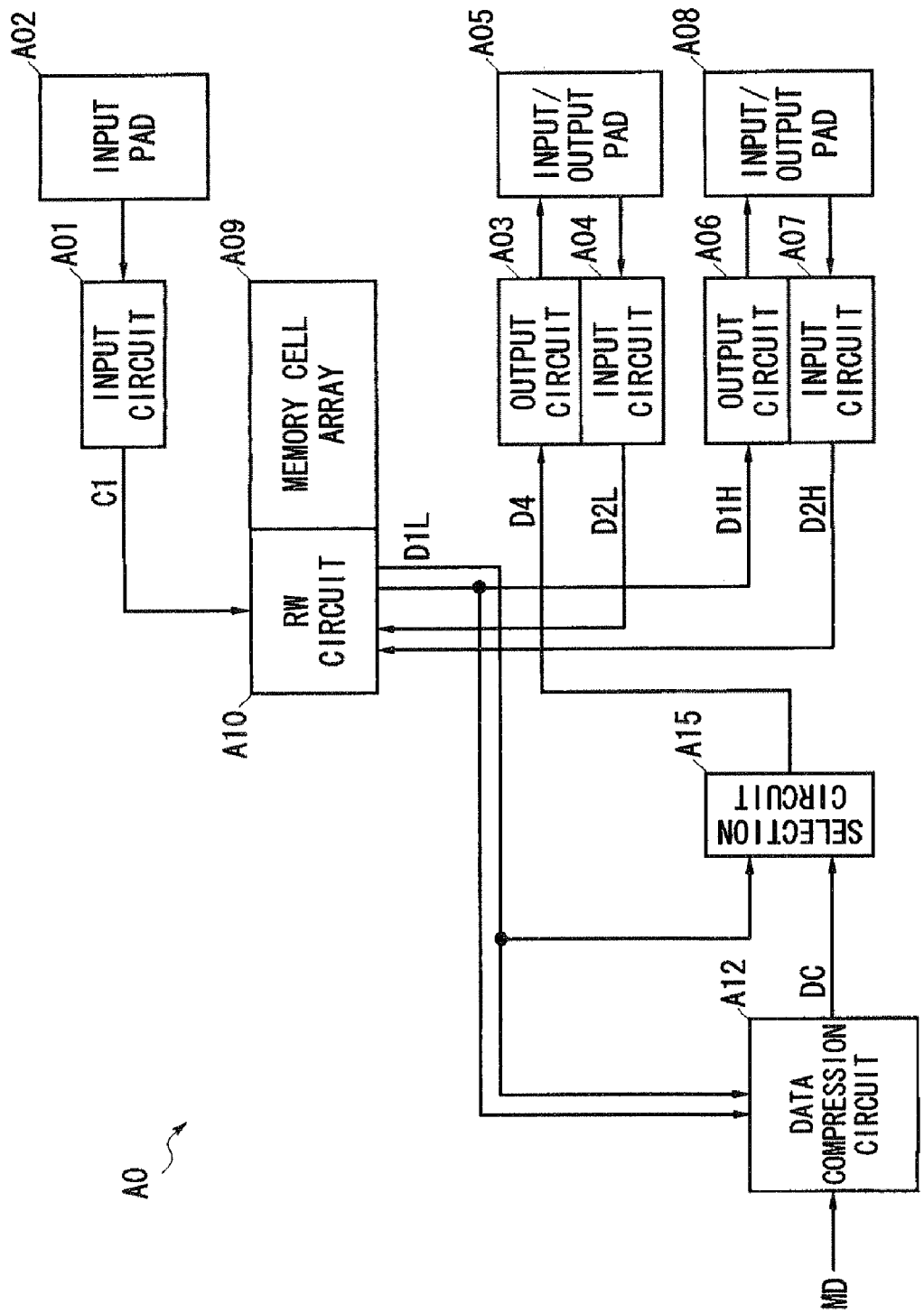
FIG. 13 illustrates a second comparative example.

FIG. 13 illustrates a second comparative example. A semiconductor device A0 of the second comparative example is formed as, for example, a DRAM, and includes an input circuit A01, an input pad A02, an output circuit A03, an input circuit A04, an input/output pad A05, an output circuit A06, an input circuit A07, an input/output pad A08, a memory cell array A09, an RW circuit A10, a data compression circuit A12 and a selection circuit A15.

Note that a mode signal MD is supplied only to the data compression circuit A12 in FIG. 13, but actually, it is also supplied to the other circuits. The mode signal MD is a signal which indicates an operation mode (either of a normal mode or a test mode) of the semiconductor device A0. For instance, the mode signal MD is supplied from a mode register used for setting the operation mode of the semiconductor device A0.

The input circuit A01 obtains a control signal supplied from the exterior via the input pad A02 and outputs as a control signal C1. In accordance with a read access operation of the RW circuit A10, the output circuit A03 obtains data D4 supplied from the selection circuit A15 and outputs to the input/output pad A05. When the mode signal MD indicates the normal mode, in accordance with a write access operation of the RW circuit A10, the input circuit A04 obtains a low-order bit of write data of the memory cell array A09 supplied from the exterior via the input/output pad A05 and outputs as data D2L. When the mode signal MD indicates the test mode, in accordance with the write access operation of the RW circuit A10, the input circuit A04 obtains compressed data corresponding to the write data of the memory cell array A09 supplied from the exterior via the input/output pad A05 and outputs as the data D2L.

When the mode signal MD indicates the normal mode, in accordance with the read access operation of the RW circuit A10, the output circuit A06 obtains data D1H supplied from the RW circuit A10 and outputs to the input/output pad A08. When the mode signal MD indicates the normal mode, in accordance with the write access operation of the RW circuit A10, the input circuit A07 obtains a high-order bit of the write data of the memory cell array A09 supplied from the exterior via the input/output pad A08 and outputs as data D2H.

The memory cell array A09 is formed by disposing a plurality of dynamic memory cells in a matrix shape. The RW circuit A10 performs the read access operation/write access operation with respect to the memory cell array A09 based on the control signal C1 supplied from the input circuit A01. The control signal C1 supplied from the input circuit A01 includes an address signal indicating memory cells being objects to be accessed, a command signal indicating the read access operation/write access operation, and a clock signal to be a reference of an operation timing of the read access operation/write access operation. The RW circuit A10 outputs data read from the memory cell array A09 by the read access operation as the data D1L and D1H. When the mode signal MD indicates the normal mode, the RW circuit A10 performs the write access operation using the data D2L and D2H supplied from the input circuits A04 and A07. When the mode signal MD indicates the test mode, the RW circuit A10 performs the write access operation using write data generated based on the data D2L supplied from the input circuit A04.

When the mode signal MD indicates the test mode, in accordance with the read access operation of the RW circuit A10, the data compression circuit A12 compresses the data D1L and D1H supplied from the RW circuit A10 and outputs as compressed data DC. When the mode signal MD indicates the normal mode, in accordance with the read access operation of the RW circuit A10, the selection circuit A15 selects the data D1L supplied from the RW circuit A10 and outputs as data D4. When the mode signal MD indicates the test mode, in accordance with the read access operation of the RW circuit A10, the selection circuit A15 selects the compressed data DC supplied from the data compression circuit A12 and outputs as the data D4.

In the second comparative example as described above, operation tests with respect to the output circuit A06 and the input circuit A07 cannot be conducted by a data compression test in the test mode, which results in lowering a test coverage of the semiconductor device A0.

Figure 14:
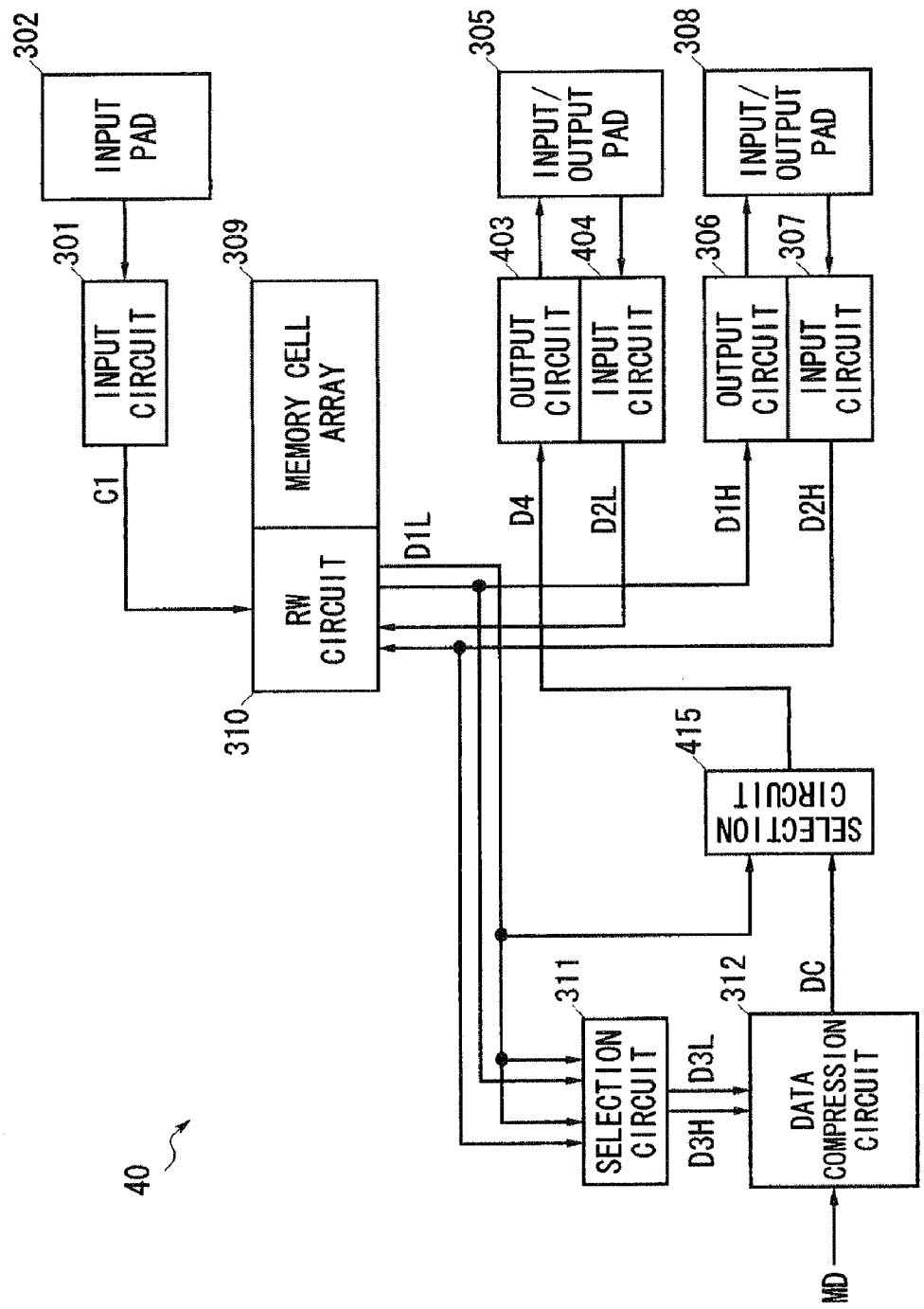
FIG. 14 illustrates a fourth embodiment.

FIG. 14 illustrates a fourth embodiment. In explaining the fourth embodiment, the same elements as those explained in the third embodiment are denoted by the same reference numerals, and detailed explanations of that will be omitted. A semiconductor device 40 of the fourth embodiment is the same as the semiconductor device 30 of the third embodiment except that it includes an output circuit 403 and an input circuit 404 instead of the output circuit 303 and the input circuit 304, the selection circuit 311 receives the data D1L instead of the data D2L, it does not include the output circuit 313 and the output pad 314, and it includes a selection circuit 415. For instance, the semiconductor device 40 of the fourth embodiment embodies the memory 2 of the system LSI 1 illustrated in FIG. 2, similarly as the semiconductor device 10 of the first embodiment.

In accordance with a read access operation of the RW circuit 310, the output circuit 403 obtains data D4 supplied from the selection circuit 415 and outputs to the input/output pad 305. When the mode signal MD indicates a normal mode, in accordance with a write access operation of the RW circuit 310, the input circuit 404 obtains a low-order bit of write data of the memory cell array 309 supplied from the exterior via the input/output pad 305 and outputs as the data D2L. When the mode signal MD indicates either of a first test mode or a second test mode, in accordance with the write access operation of the RW circuit 310, the input circuit 404 obtains compressed data corresponding to the write data of the memory cell array 309 supplied from the exterior via the input/output pad 305 and outputs as the data D2L.

When the mode signal MD indicates the normal mode, in accordance with the read access operation of the RW circuit 310, the selection circuit 415 selects the data D1L supplied from the RW circuit 310 and outputs as the data D4. When the mode signal MD indicates either of the first test mode or the second test mode, in accordance with the read access operation of the RW circuit 310, the selection circuit 415 selects the compressed data DC supplied from the data compression circuit 312 and outputs as the data D4.

When the input/output pad 305 is used in a wafer test of the semiconductor device 40 (when a test is conducted by bringing a probe into contact with the input/output pad 305), it means that operation tests are conducted with respect to the output circuit 403 and the input circuit 404, so that the output circuit 403 and the input circuit 404 can be excluded from test objects of a data compression test in the second test mode. Accordingly, in the semiconductor device 40, when the mode signal MD indicates the second test mode, the data to be compressed by the data compression circuit 312 are set to be the data D1L supplied from the RW circuit 310 and the data D2H supplied from the input circuit 307 so that only the operation tests with respect to the output circuit 306 and the input circuit 307 can be conducted by the data compression test in the second test mode. As described above, also in the fourth embodiment, it is possible to easily improve a test coverage of the semiconductor device 40 by utilizing a data compression test function, similarly as in the third embodiment. Further, if the output circuit 403 and the input circuit 404 are the test objects of the data compression test in the second test mode, when the data compression test in the second test mode is executed, there is required a time regarding the input/output pad 305 to charge and discharge a capacitor between the probe and a tester, which becomes a main cause for increasing a test time. Accordingly, by excluding the output circuit 403 and the input circuit 404 from the test objects of the data compression test in the second test mode, it is possible to reduce the test time.

Further, in the fourth embodiment, when the mode signal MD indicates either of the first test mode or the second test mode, the compressed data DC supplied from the data compression circuit 312 are supplied to the input/output pad 305 via the selection circuit 415 and the output circuit 403. Accordingly, the use of the output circuit 313 and the output pad 314 in the third embodiment can be eliminated, which contributes to the reduction in a chip size and the number of pads.

Figure 15:
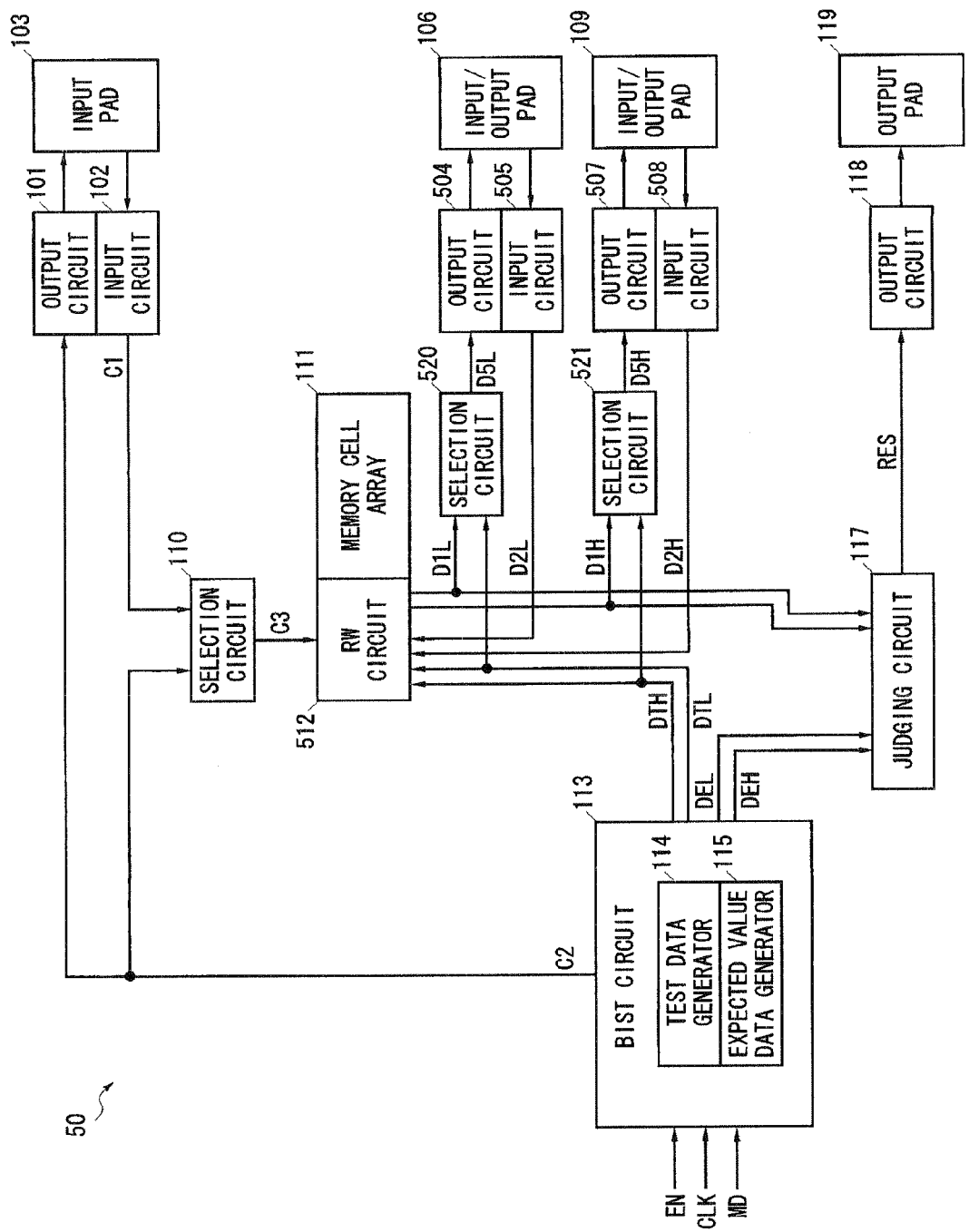
FIG. 15 illustrates a fifth embodiment.

FIG. 15 illustrates a fifth embodiment. In explaining the fifth embodiment, the same elements as those explained in the first embodiment are denoted by the same reference numerals, and detailed explanations of that will be omitted. A semiconductor device 50 of the fifth embodiment is the same as the semiconductor device 10 of the first embodiment except that it includes an output circuit 504, an input circuit 505, an output circuit 507, an input circuit 508 and an RW circuit 512 instead of the output circuit 104, the input circuit 105, the output circuit 107, the input circuit 108 and the RW circuit 112, it does not include the selection circuit 116, the judging circuit 117 receives the data D1L and D1H instead of the data D3L and D3H, and it includes selection circuits 520 and 521. For instance, the semiconductor device 50 of the fifth embodiment embodies the memory 2 of the system LSI 1 illustrated in FIG. 2, similarly as the semiconductor device 10 of the first embodiment.

When the mode signal MD indicates a normal mode, in accordance with a read access operation of the RW circuit 512, the output circuit 504 obtains data D5L supplied from the selection circuit 520 and outputs to the input/output pad 106. When the mode signal MD indicates a second test mode, in accordance with a write access operation of the RW circuit 512, the output circuit 504 obtains the data D5L supplied from the selection circuit 520 and outputs to the input/output pad 106.

When the mode signal MD indicates the normal mode, in accordance with the write access operation of the RW circuit 512, the input circuit 505 obtains a low-order bit of write data of the memory cell array 111 supplied from the exterior via the input/output pad 106 and outputs as the data D2L. When the mode signal MD indicates the second test mode, in accordance with the write access operation of the RW circuit 512, the input circuit 505 obtains data supplied from the output circuit 504 via the input/output pad 106 and outputs as the data D2L.

When the mode signal MD indicates the normal mode, in accordance with the read access operation of the RW circuit 512, the output circuit 507 obtains data D5H supplied from the selection circuit 521 and outputs to the input/output pad 109. When the mode signal MD indicates the second test mode, in accordance with the write access operation of the RW circuit 512, the output circuit 507 obtains the data D5H supplied from the selection circuit 521 and outputs to the input/output pad 109.

When the mode signal MD indicates the normal mode, in accordance with the write access operation of the RW circuit 512, the input circuit 508 obtains a high-order bit of the write data of the memory cell array 111 supplied from the exterior via the input/output pad 109 and outputs as the data D2H. When the mode signal MD indicates the second test mode, in accordance with the write access operation of the RW circuit 512, the input circuit 508 obtains data supplied from the output circuit 507 via the input/output pad 109 and outputs as the data D2H.

The RW circuit 512 performs the read access operation/write access operation with respect to the memory cell array 111 based on the control signal C3 supplied from the selection circuit 110. The RW circuit 512 outputs data read from the memory cell array 111 by the read access operation as the data D1L and D1H. When the mode signal MD indicates either of the normal mode or the second test mode, the RW circuit 512 performs the write access operation using the data D2L and D2H supplied from the input circuits 505 and 508. When the mode signal MD indicates the first test mode, the RW circuit 512 performs the write access operation using the test data DTL and DTH supplied from the BIST circuit 113.

When the mode signal MD indicates the normal mode, in accordance with the read access operation of the RW circuit 512, the selection circuit 520 selects the data D1L supplied from the RW circuit 512 and outputs as the data D5L. When the mode signal MD indicates the second test mode, in accordance with the write access operation of the RW circuit 512, the selection circuit 520 selects the test data DTL supplied from the BIST circuit 113 and outputs as the data D5L.

When the mode signal MD indicates the normal mode, in accordance with the read access operation of the RW circuit 512, the selection circuit 521 selects the data D1H supplied from the RW circuit 512 and outputs as the data D5H. When the mode signal MD indicates the second test mode, in accordance with the write access operation of the RW circuit 512, the selection circuit 521 selects the test data DTH supplied from the BIST circuit 113 and outputs as the data D5H.

In the fifth embodiment as described above, when the mode signal MD indicates the second test mode, the control signal C2 supplied from the BIST circuit 113 is supplied to the RW circuit 512 via the output circuit 101, the input circuit 102 and the selection circuit 110. Further, when the mode signal MD indicates the second test mode, the test data DTL and DTH supplied from the BIST circuit 113 are supplied to the RW circuit 512 via the selection circuits 520 and 521, the output circuits 504 and 507, and the input circuits 505 and 508 as the write data of the memory cell array 111. Therefore, operation tests with respect to the input circuit 102, the output circuits 504 and 507, and the input circuits 505 and 508 can be conducted by a self test in the second test mode. As described above, also in the fifth embodiment, it is possible to easily improve a test coverage of the semiconductor device 50 by utilizing a self-test function, similarly as in the first embodiment.

Figure 16:
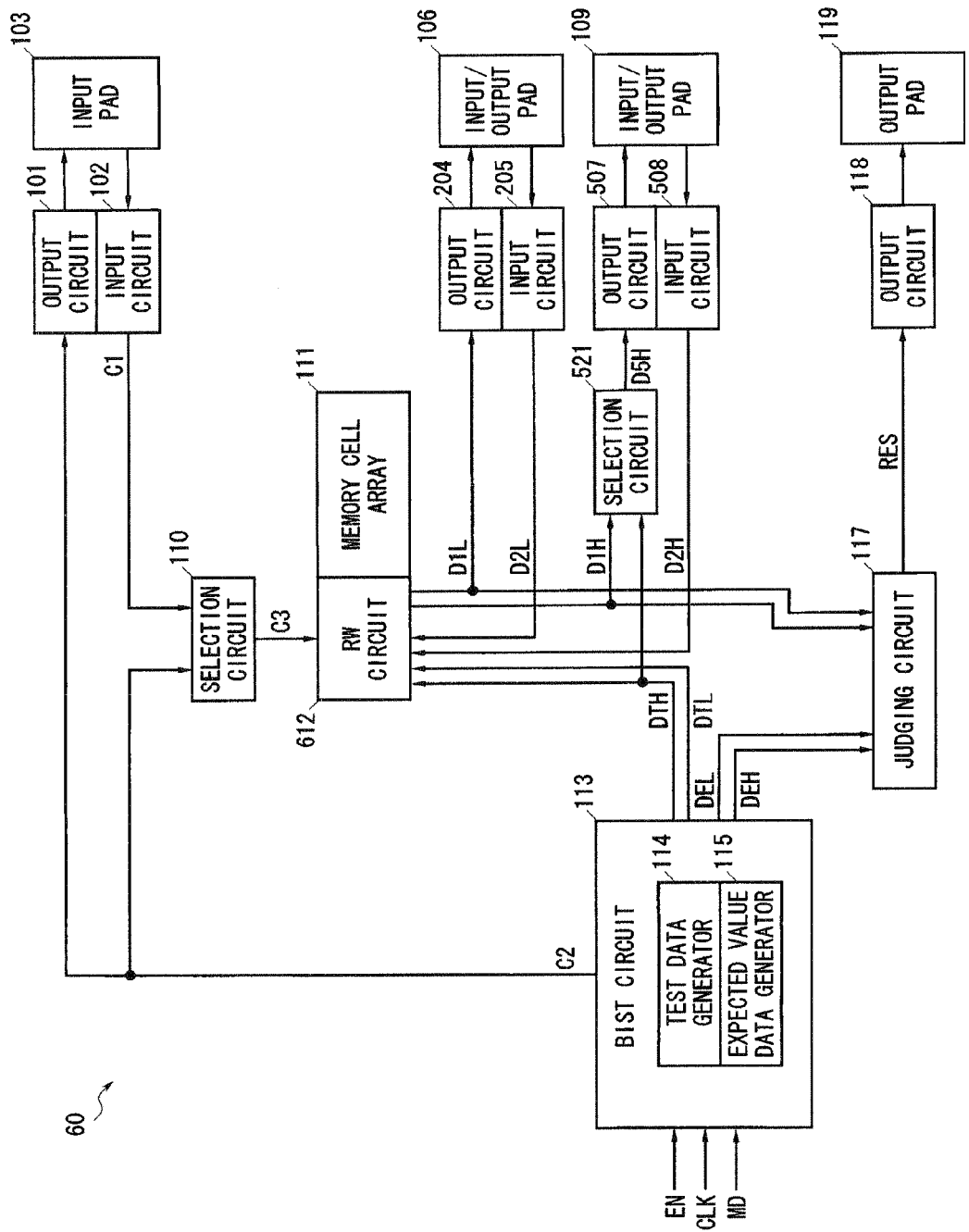
FIG. 16 illustrates a sixth embodiment.

FIG. 16 illustrates a sixth embodiment. In explaining the sixth embodiment, the same elements as those explained in the first, second and fifth embodiments are denoted by the same reference numerals, and detailed explanations of that will be omitted. A semiconductor device 60 of the sixth embodiment is the same as the semiconductor device 50 of the fifth embodiment except that it includes an output circuit 204, an input circuit 205 and an RW circuit 612 instead of the output circuit 504, the input circuit 505 and the RW circuit 512, and it does not include the selection circuit 520. For instance, the semiconductor device 60 of the sixth embodiment embodies the memory 2 of the system LSI 1 illustrated in FIG. 2, similarly as the semiconductor device 10 of the first embodiment.

The RW circuit 612 performs a read access operation/write access operation with respect to the memory cell array 111 based on the control signal C3 supplied from the selection circuit 110. The RW circuit 612 outputs data read from the memory cell array 111 by the read access operation as the data D1L and D1H. When the mode signal MD indicates a normal mode, the RW circuit 612 performs the write access operation using the data D2L and D2H supplied from the input circuits 205 and 508. When the mode signal MD indicates a first test mode, the RW circuit 612 performs the write access operation using the test data DTL and DTH supplied from the BIST circuit 113. When the mode signal MD indicates a second test mode, the RW circuit 612 performs the write access operation using the test data DTL supplied from the BIST circuit 113 and the data D2H supplied from the input circuit 508. Also in the sixth embodiment as described above, the same effect as in the first and second embodiments can be obtained.

Figure 17:
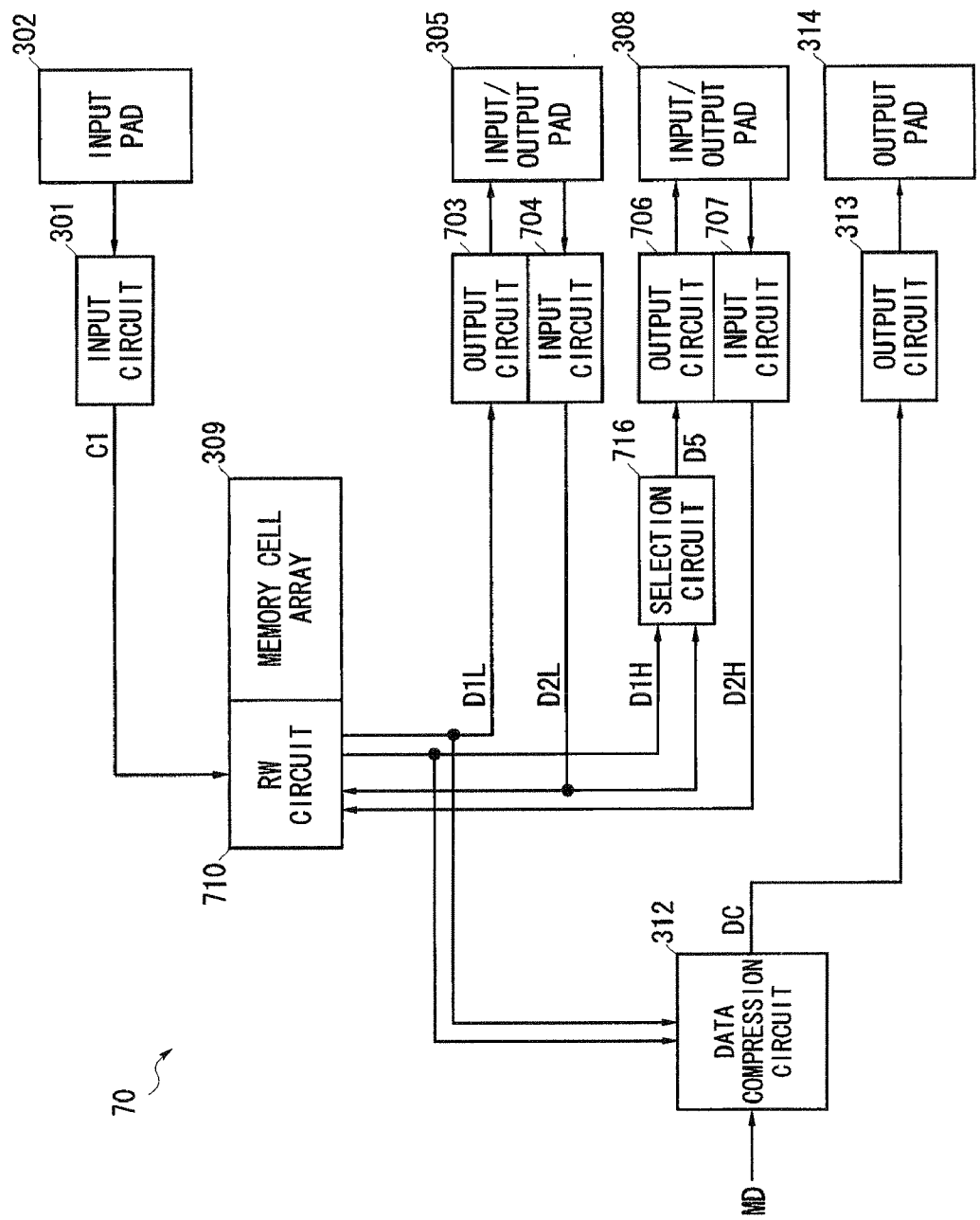
FIG. 17 illustrates a seventh embodiment.

FIG. 17 illustrates a seventh embodiment. In explaining the seventh embodiment, the same elements as those explained in the third embodiment are denoted by the same reference numerals, and detailed explanations of that will be omitted. A semiconductor device 70 of the seventh embodiment is the same as the semiconductor device 30 of the third embodiment except that it includes an output circuit 703, an input circuit 704, an output circuit 706, an input circuit 707 and an RW circuit 710 instead of the output circuit 303, the input circuit 304, the output circuit 306, the input circuit 307 and the RW circuit 310, it does not include the selection circuit 311, the data compression circuit 312 receives the data D1L and D1H instead of the data D3L and D3H, and it includes a selection circuit 716. For instance, the semiconductor device 70 of the seventh embodiment embodies the memory 2 of the system LSI 1 illustrated in FIG. 2, similarly as the semiconductor device 10 of the first embodiment.

When the mode signal MD indicates a normal mode, in accordance with a read access operation of the RW circuit 710, the output circuit 703 obtains the data D1L supplied from the RW circuit 710 and outputs to the input/output pad 305. When the mode signal MD indicates the normal mode, in accordance with a write access operation of the RW circuit 710, the input circuit 704 obtains a low-order bit of write data of the memory cell array 309 supplied from the exterior via the input/output pad 305 and outputs as the data D2L. When the mode signal MD indicates either of a first test mode or a second test mode, in accordance with the write access operation of the RW circuit 710, the input circuit 704 obtains compressed data corresponding to the write data of the memory cell array 309 supplied from the exterior via the input/output pad 305 and outputs as the data D2L.

When the mode signal MD indicates the normal mode, in accordance with the read access operation of the RW circuit 710, the output circuit 706 obtains data D5 supplied from the selection circuit 716 and outputs to the input/output pad 308. When the mode signal MD indicates the second test mode, in accordance with the write access operation of the RW circuit 710, the output circuit 706 obtains the data D5 supplied from the selection circuit 716 and outputs to the input/output pad 308.

When the mode signal MD indicates the normal mode, in accordance with the write access operation of the RW circuit 710, the input circuit 707 obtains a high-order bit of the write data of the memory cell array 309 supplied from the exterior via the input/output pad 308 and outputs as the data D2H. When the mode signal MD indicates the second test mode, in accordance with the write access operation of the RW circuit 710, the input circuit 707 obtains data supplied from the output circuit 706 via the input/output pad 308 and outputs as the data D2H.

The RW circuit 710 performs the read access operation/ write access operation with respect to the memory cell array 309 based on the control signal C1 supplied from the input circuit 301. The RW circuit 710 outputs data read from the memory cell array 309 by the read access operation as the data D1L and D1H. When the mode signal MD indicates the normal mode, the RW circuit 710 performs the write access operation using the data D2L and D2H supplied from the input circuits 704 and 707. When the mode signal MD indicates the first test mode, the RW circuit 710 performs the write access operation using write data generated based on the data D2L supplied from the input circuit 704. When the mode signal MD indicates the second test mode, the RW circuit 710 performs the write access operation using write data generated based on the data D2H supplied from the input circuit 707.

When the mode signal MD indicates the normal mode, in accordance with the read access operation of the RW circuit 710, the selection circuit 716 selects the data D1H supplied from the RW circuit 710 and outputs as the data D5. When the mode signal MD indicates the second test mode, in accordance with the write access operation of the RW circuit 710, the selection circuit 716 selects the data D2L supplied from the input circuit 704 and outputs as the data D5.

In the seventh embodiment as described above, when the mode signal MD indicates the second test mode, the compressed data corresponding to the write data of the memory cell array 309 supplied from the exterior via the input/output pad 305 are supplied to the RW circuit 710 via the input circuit 704, the selection circuit 716, the output circuit 706 and the input circuit 707. Therefore, operation tests with respect to the output circuit 706 and the input circuits 704 and 707 can be conducted by a data compression test in the second test mode. As described above, also in the seventh embodiment, it is possible to easily improve a test coverage of the semiconductor device 70 by utilizing a data compression test function, similarly as in the third embodiment.

Figure 18:
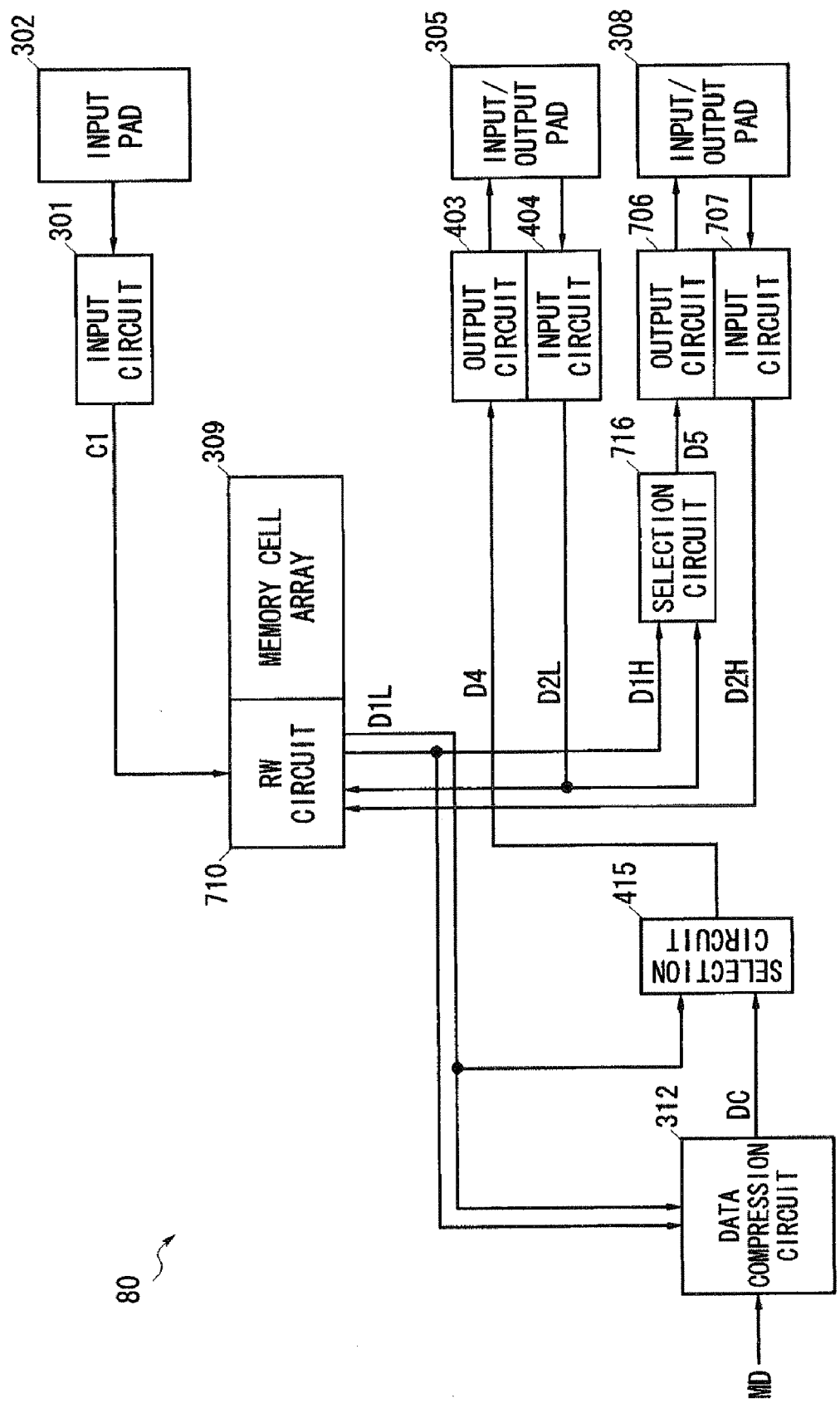
FIG. 18 illustrates an eighth embodiment.

FIG. 18 illustrates an eighth embodiment. In explaining the eighth embodiment, the same elements as those explained in the third, fourth and seventh embodiments are denoted by the same reference numerals, and detailed explanations of that will be omitted. A semiconductor device 80 of the eighth embodiment is the same as the semiconductor device 70 of the seventh embodiment except that it includes an output circuit 403 and an input circuit 404 instead of the output circuit 703 and the input circuit 704, it does not include the input circuit 313 and the output pad 314, and it includes a selection circuit 415. For instance, the semiconductor device 80 of the eighth embodiment embodies the memory 2 of the system LSI 1 illustrated in FIG. 2, similarly as the semiconductor device 10 of the first embodiment. Also in the eighth embodiment as described above, the same effect as in the third and fourth embodiments can be obtained.

Note that in the first to eighth embodiments, examples where the semiconductor device is formed as the DRAM are described, but, the semiconductor device may be formed as an SRAM (Static RAM) or a pseudo SRAM. Further, in the first to eighth embodiments, examples where the storage circuit is configured by the memory cell array (the plurality of memory cells) are described, but, the storage circuit may be configured by, for example, a plurality of registers.

A proposition of the aforementioned embodiment is to provide a technique to easily improve a test coverage of a semiconductor device.

According to one aspect of the embodiment, a semiconductor device to be mounted in a system includes a storage circuit, a self-test circuit, a first data output circuit, a first data input circuit, a second data output circuit, a second data input circuit, a comparison object selection circuit, a judging circuit and a test result output circuit. The storage circuit performs data reading or data writing according to an external control signal in a normal mode, and performs data reading or data writing according to an internal control signal in a first test mode and a second test mode. The self-test circuit generates the internal control signal, test data to be used as write data of the storage circuit and expected value data to be compared with read data of the storage circuit to output in the first test mode and the second test mode. The first data output circuit obtains a corresponding part of the read data of the storage circuit to output to a first input/output pad in the normal mode and the second test mode. The first data input circuit obtains a corresponding part of the write data of the storage circuit via the first input/output pad to output in the normal mode, and obtains output data of the first data output circuit via the first input/output pad to output in the second test mode. The second data output circuit obtains a corresponding part of the read data of the storage circuit to output to a second input/ output pad in the normal mode and the second test mode. The second data input circuit obtains a corresponding part of the write data of the storage circuit via the second input/output pad to output in the normal mode, and obtains output data of the second data output circuit via the second input/output pad to output in the second test mode. The comparison object selection circuit selects the read data of the storage circuit to output in the first test mode, and selects data including output data of the first data input circuit and output data of the second data input circuit to output in the second test mode. The judging circuit performs a test judgment by comparing output data of the comparison object selection circuit with the expected value data and outputs a test result signal in the first test mode and the second test mode. The test result output circuit obtains the test result signal to output to an output pad in the first test mode and the second test mode.

In such a semiconductor device, since the data to be compared with the expected value data by the judging circuit in the second test mode is the read data of the storage circuit passing through the first and second data output circuits and the first and second data input circuits, operation tests with respect to the first and second data output circuits and the first and second data input circuits can be conducted by a self test in the second test mode. As above, it is possible to easily enhance a test coverage of the semiconductor device by utilizing a self-test function.

According to another aspect of the embodiment, a semiconductor device to be mounted in a system includes a storage circuit, a self-test circuit, a first data output circuit, a first data input circuit, a second data output circuit, a second data input circuit, a comparison object selection circuit, a judging circuit and a test result output circuit. The storage circuit performs data reading or data writing according to an external control signal in a normal mode, and performs data reading or data writing according to an internal control signal in a first test mode and a second test mode. The self-test circuit generates the internal control signal, test data to be used as write data of the storage circuit and expected value data to be compared with read data of the storage circuit to output in the first test mode and the second test mode. The first data output circuit obtains a corresponding part of the read data of the storage circuit to output to a first input/output pad in the normal mode. The first data input circuit obtains a corresponding part of the write data of the storage circuit via the first input/output pad to output in the normal mode. The second data output circuit obtains a corresponding part of the read data of the storage circuit to output to a second input/output pad in the normal mode and the second test mode. The second data input circuit obtains a corresponding part of the write data of the storage circuit via the second input/output pad to output in the normal mode, and obtains output data of the second data output circuit via the second input/output pad to output in the second test mode. The comparison object selection circuit selects the read data of the storage circuit to output in the first test mode, and selects data including the corresponding part in the first input/output pad of the read data of the storage circuit and output data of the second data input circuit to output in the second test mode. The judging circuit performs a test judgment by comparing output data of the comparison object selection circuit with the expected value data and outputs a test result signal in the first test mode and the second test mode. The test result output circuit obtains the test result signal to output to an output pad in the first test mode and the second test mode.

When the first input/output pad is used in a wafer test of the semiconductor device (when a test is conducted by bringing a probe into contact with the first input/output pad), it means that operation tests are conducted with respect to the first data output circuit and the first data input circuit, so that the first data output circuit and the first data input circuit can be excluded from test objects of a self test in the second test mode. Accordingly, in the aforementioned semiconductor device, only the operation tests with respect to the second data output circuit and the second data input circuit can be conducted by the self test in the second test mode, since the data to be compared with the expected value data by the judging circuit in the second test mode is the read data of the storage circuit in which the corresponding part in the second input/output pad passes through the second data output circuit and the second data input circuit. As above, it is possible to easily improve a test coverage of the semiconductor device by utilizing a self-test function. Further, if the first data output circuit and the first data input circuit are the test objects of the self test in the second test mode, when the self test in the second test mode is executed, there is required a time regarding the first input/output pad to charge and discharge a capacitor between the probe and a tester, which becomes a main cause for increasing a test time. Accordingly, by excluding the first data output circuit and the first data input circuit from the test objects of the self test in the second test mode, it is possible to reduce the test time.

According to still another aspect of the embodiment, a semiconductor device to be mounted in a system includes a storage circuit, a first data output circuit, a first data input circuit, a second data output circuit, a second data input circuit, a compression object selection circuit, a data compression circuit and a compression result output circuit. The storage circuit performs data reading or data writing according to an external control signal in a normal mode, a first test mode and a second test mode. The first data output circuit obtains a corresponding part of read data of the storage circuit to output to a first input/output pad in the normal mode and the second test mode. The first data input circuit obtains a corresponding part of write data of the storage circuit via the first input/output pad to output in the normal mode, obtains compressed data corresponding to the write data of the storage circuit via the first input/output pad to output in the first test mode and the second test mode, and obtains output data of the first data output circuit via the first input/output pad to output in the second test mode. The second data output circuit obtains a corresponding part of the read data of the storage circuit to output to a second input/output pad in the normal mode and the second test mode. The second data input circuit obtains a corresponding part of the write data of the storage circuit via the second input/output pad to output in the normal mode, and obtains output data of the second data output circuit via the second input/output pad to output in the second test mode. The compression object selection circuit selects the read data of the storage circuit to output in the first test mode, and selects data including output data of the first data input circuit and output data of the second data input circuit to output in the second test mode. The data compression circuit compresses output data of the compression object selection circuit to output in the first test mode and the second test mode. The compression result output circuit obtains output data of the data compression circuit to output to an output pad in the first test mode and the second test mode.

In such a semiconductor device, since the data to be compressed by the data compression circuit in the second test mode is the read data of the storage circuit passing through the first and second data output circuits and the first and second data input circuits, operation tests with respect to the first and second data output circuits and the first and second data input circuits can be conducted by a data compression test in the second test mode. As above, it is possible to easily enhance a test coverage of the semiconductor device by utilizing a data compression test function.

According to yet another aspect of the embodiment, a semiconductor device to be mounted in a system includes a storage circuit, a first data output circuit, a first data input circuit, a second data output circuit, a second data input circuit, a compression object selection circuit, a data compression circuit and an output object selection circuit. The storage circuit performs data reading or data writing according to an external control signal in a normal mode, a first test mode and a second test mode. The first data output circuit obtains input data to output to a first input/output pad in the normal mode, the first test mode and the second test mode. The first data input circuit obtains a corresponding part of write data of the storage circuit via the first input/output pad to output in the normal mode, and obtains compressed data corresponding to the write data of the storage circuit via the first input/output pad to output in the first test mode and the second test mode. The second data output circuit obtains a corresponding part of read data of the storage circuit to output to a second input/output pad in the normal mode and the second test mode. The second data input circuit obtains a corresponding part of the write data of the storage circuit via the second input/output pad to output in the normal mode, and obtains output data of the second data output circuit via the second input/output pad to output in the second test mode. The compression object selection circuit selects the read data of the storage circuit to output in the first test mode, and selects data including the corresponding part in the first input/output pad of the read data of the storage circuit and output data of the second data output circuit to output in the second test mode. The data compression circuit compresses output data of the compression object selection circuit to output in the first test mode and the second test mode. The output object selection circuit selects the corresponding part in the first input/output pad of the read data of the storage circuit to output as the input data of the first data output circuit in the normal mode, and selects output data of the data compression circuit to output as the input data of the first data output circuit in the first test mode and the second test mode.

When the first input/output pad is used in a wafer test of the semiconductor device (when a test is conducted by bringing a probe into contact with the first input/output pad), it means that operation tests are conducted with respect to the first data output circuit and the first data input circuit, so that the first data output circuit and the first data input circuit can be excluded from test objects of a data compression test in the second test mode. Accordingly, in the aforementioned semiconductor device, only the operation tests with respect to the second data output circuit and the second data input circuit can be conducted by the data compression test in the second test mode, since the data to be compressed by the data compression circuit in the second test mode is the read data of the storage circuit in which the corresponding part in the second input/output pad passes through the second data output circuit and the second data input circuit. As above, it is possible to easily improve a test coverage of the semiconductor device by utilizing a data compression test function. Further, if the first data output circuit and the first data input circuit are the test objects of the data compression test in the second test mode, when the data compression test in the second test mode is executed, there is required a time regarding the first input/output pad to charge and discharge a capacitor between the probe and a tester, which becomes a main cause for increasing a test time. Accordingly, by excluding the first data output circuit and the first data input circuit from the test objects of the data compression test in the second test mode, it is possible to reduce the test time.

According to still yet another aspect of the embodiment, a semiconductor device to be mounted in a system includes a storage circuit, a self-test circuit, a first data selection circuit, a first data output circuit, a first data input circuit, a second data selection circuit, a second data output circuit, a second data input circuit, a judging circuit and a test result output circuit. The storage circuit performs data reading or data writing according to an external control signal in a normal mode, and performs data reading or data writing according to an internal control signal in a first test mode and a second test mode. The self-test circuit generates the internal control signal, test data to be used as write data of the storage circuit and expected value data to be compared with read data of the storage circuit to output in the first test mode and the second test mode. The first data selection circuit selects a corresponding part of the read data of the storage circuit to output in the normal mode, and selects a corresponding part of the test data to output in the second test mode. The first data output circuit obtains output data of the first data selection circuit to output to a first input/output pad in the normal mode and the second test mode. The first data input circuit obtains a corresponding part of the write data of the storage circuit via the first input/output pad to output in the normal mode, and obtains output data of the first data output circuit via the first input/output pad to output as the corresponding part of the write data of the storage circuit in the second test mode. The second data selection circuit selects a corresponding part of the read data of the storage circuit to output in the normal mode, and selects a corresponding part of the test data to output in the second test mode. The second data output circuit obtains output data of the second data selection circuit to output to a second input/output pad in the normal mode and the second test mode. The second data input circuit obtains a corresponding part of the write data of the storage circuit via the second input/output pad to output in the normal mode, and obtains output data of the second data output circuit via the second input/output pad to output as the corresponding part of the write data of the storage circuit in the second test mode. The judging circuit performs a test judgment by comparing the read data of the storage circuit with the expected value data and outputs a test result signal in the first test mode and the second test mode. The test result output circuit obtains the test result signal to output to an output pad in the first test mode and the second test mode.

In such a semiconductor device, since the data to be written into the storage circuit in the second test mode is the test data passing through the first and second data output circuits and the first and second data input circuits, operation tests with respect to the first and second data output circuits and the first and second data input circuits can be conducted by a self test in the second test mode. As above, it is possible to easily enhance a test coverage of the semiconductor device by utilizing a self-test function.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor device, comprising:
   a storage circuit performing data reading or data writing according to an external control signal in a normal mode, and performing data reading or data writing according to an internal control signal in a first test mode and a second test mode;
   a self-test circuit generating the internal control signal, test data to be used as write data of the storage circuit and expected value data to be compared with read data of the storage circuit in the first test mode and the second test mode;
   a first data output circuit obtaining a corresponding part of the read data of the storage circuit and outputting the corresponding part of the read data to a first input/output pad in the normal mode and the second test mode;
   a first data input circuit obtaining a corresponding part of the write data of the storage circuit via the first input/output pad in the normal mode, and obtaining output data of the first data output circuit via the first input/output pad in the second test mode;
   a second data output circuit obtaining a corresponding part of the read data of the storage circuit and outputting the corresponding part of the read data to a second input/output pad in the normal mode and the second test mode;
   a second data input circuit obtaining a corresponding part of the write data of the storage circuit via the second input/output pad in the normal mode, and obtaining output data of the second data output circuit via the second input/output pad in the second test mode;
   a comparison object selection circuit selecting the read data of the storage circuit in the first test mode, and selecting data including output data of the first data input circuit and output data of the second data input circuit in the second test mode;
   a judging circuit performing a test judgment by comparing output data of the comparison object selection circuit with the expected value data and outputting a test result signal in the first test mode and the second test mode; and
   a test result output circuit obtaining the test result signal and outputting the test result signal to an output pad in the first test mode and the second test mode.

2. The semiconductor device according to claim 1, further comprising:
   a control signal output circuit obtaining the internal control signal and outputting the internal control signal to an input pad in the second test mode;
   a control signal input circuit obtaining the external control signal via the input pad in the normal mode, and obtaining an output signal of the control signal output circuit via the input pad in the second test mode; and
   a control signal selection circuit selecting the internal control signal in the first test mode, and selecting an output signal of the control signal input circuit in the normal mode and the second test mode, wherein
   the storage circuit performs data reading or data writing according to an output signal of the control signal selection circuit.

3. The semiconductor device according to claim 2, wherein a drivability of the control signal output circuit is smaller than drivabilities of the first data output circuit, the second data output circuit and the test result output circuit.

4. The semiconductor device according to claim 1, wherein the external control signal and the internal control signal comprise an address signal indicating a destination to be accessed.

5. The semiconductor device according to claim 1, wherein the external control signal and the internal control signal comprise a command signal indicating data reading or data writing.

6. The semiconductor device according to claim 1, wherein the external control signal and the internal control signal comprise a clock signal defining an operation timing of data reading or data writing.

7. The semiconductor device according to claim 1, wherein:
   the storage circuit, the self-test circuit, the first data output circuit, the first data input circuit, the second data output circuit, the second data input circuit, the judging circuit and the test result output circuit are commonly mounted on one of a plurality of semiconductor chips to be housed in a same package; and
   at least one of the input pad, the first input/output pad and the second input/output pad is coupled to a pad of another semiconductor chip without being coupled to an external pin of the package.

8. The semiconductor device according to claim 1, wherein the storage circuit includes a plurality of memory cells.

9. The semiconductor device according to claim 1, wherein the storage circuit includes a plurality of registers.

10. A semiconductor device, comprising:
    a storage circuit performing data reading or data writing according to an external control signal in a normal mode, and performing data reading or data writing according to an internal control signal in a first test mode and a second test mode;
    a self-test circuit generating the internal control signal, test data to be used as write data of the storage circuit and expected value data to be compared with read data of the storage circuit in the first test mode and the second test mode;
    a first data output circuit obtaining a corresponding part of the read data of the storage circuit and outputting the corresponding part of the read data to a first input/output pad in the normal mode;
    a first data input circuit obtaining a corresponding part of the write data of the storage circuit via the first input/output pad in the normal mode;
    a second data output circuit obtaining a corresponding part of the read data of the storage circuit and outputting the corresponding part of the read data to a second input/output pad in the normal mode and the second test mode;
    a second data input circuit obtaining a corresponding part of the write data of the storage circuit via the second input/output pad in the normal mode, and obtaining output data of the second data output circuit via the second input/output pad in the second test mode;
    a comparison object selection circuit selecting the read data of the storage circuit in the first test mode, and selecting data including the corresponding part in the first input/output pad of the read data of the storage circuit and output data of the second data input circuit in the second test mode;
    a judging circuit performing a test judgment by comparing output data of the comparison object selection circuit with the expected value data and outputting a test result signal in the first test mode and the second test mode; and
    a test result output circuit obtaining the test result signal and outputting the test result signal to an output pad in the first test mode and the second test mode.

11. A semiconductor device, comprising:
a storage circuit performing data reading or data writing according to an external control signal in a normal mode, a first test mode and a second test mode;
a first data output circuit obtaining a corresponding part of read data of the storage circuit and outputting the corresponding part of the read data to a first input/output pad in the normal mode and the second test mode;
a first data input circuit obtaining a corresponding part of write data of the storage circuit via the first input/output pad in the normal mode, obtaining compressed data corresponding to the write data of the storage circuit via the first input/output pad in the first test mode and the second test mode, and obtaining output data of the first data output circuit via the first input/output pad in the second test mode;
a second data output circuit obtaining a corresponding part of the read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;
a compression object selection circuit selecting the read data of the storage circuit in the first test mode, and selecting data including output data of the first data input circuit and output data of the second data input circuit in the second test mode;
a data compression circuit compressing output data of the compression object selection circuit in the first test mode and the second test mode; and
a compression result output circuit obtaining output data of the data compression circuit and outputting the output data to an output pad in the first test mode and the second test mode.

12. A semiconductor device, comprising:
a storage circuit performing data reading or data writing according to an external control signal in a normal mode, a first test mode and a second test mode;
a first data output circuit obtaining input data and outputting the input data to a first input/output pad in the normal mode, the first test mode and the second test mode;
a first data input circuit obtaining a corresponding part of write data of the storage circuit via the first input/output pad in the normal mode, and obtaining compressed data corresponding to the write data of the storage circuit via the first input/output pad in the first test mode and the second test mode;
a second data output circuit obtaining a corresponding part of read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;
a compression object selection circuit selecting the read data of the storage circuit in the first test mode, and selecting data including the corresponding part in the first input/output pad of the read data of the storage circuit and output data of the second data output circuit in the second test mode;
a data compression circuit compressing output data of the compression object selection circuit in the first test mode and the second test mode; and
an output object selection circuit selecting the corresponding part in the first input/output pad of the read data of the storage circuit as the input data of the first data output circuit in the normal mode, and selecting output data of the data compression circuit as the input data of the first data output circuit in the first test mode and the second test mode.

13. A semiconductor device, comprising:
a storage circuit performing data reading or data writing according to an external control signal in a normal mode, and performing data reading or data writing according to an internal control signal in a first test mode and a second test mode;
a self-test circuit generating the internal control signal, test data to be used as write data of the storage circuit and expected value data to be compared with read data of the storage circuit in the first test mode and the second test mode;
a first data selection circuit selecting a corresponding part of the read data of the storage circuit in the normal mode, and selecting a corresponding part of the test data in the second test mode;
a first data output circuit obtaining output data of the first data selection circuit and outputting the output data to a first input/output pad in the normal mode and the second test mode;
a first data input circuit obtaining a corresponding part of the write data of the storage circuit via the first input/output pad in the normal mode, and obtaining output data of the first data output circuit via the first input/output pad as the corresponding part of the write data of the storage circuit in the second test mode;
a second data selection circuit selecting a corresponding part of the read data of the storage circuit in the normal mode, and selecting a corresponding part of the test data in the second test mode;
a second data output circuit obtaining output data of the second data selection circuit to and outputting the output data to a second input/output pad in the normal mode and the second test mode;
a second data input circuit obtaining a corresponding part of the write data of the storage circuit via the second input/output pad in the normal mode, and obtaining output data of the second data output circuit via the second input/output pad as the corresponding part of the write data of the storage circuit in the second test mode;
a judging circuit performing a test judgment by comparing the read data of the storage circuit with the expected value data and outputting a test result signal in the first test mode and the second test mode; and
a test result output circuit obtaining the test result signal and outputting the test result signal to an output pad in the first test mode and the second test mode.

14. A system comprising a semiconductor device, comprising:
a storage circuit performing data reading or data writing according to an external control signal in a normal mode, and performing data reading or data writing according to an internal control signal in a first test mode and a second test mode;
a self-test circuit generating the internal control signal, test data to be used as write data of the storage circuit and expected value data to be compared with read data of the storage circuit in the first test mode and the second test mode;
a first data output circuit obtaining a corresponding part of the read data of the storage circuit and outputting the corresponding part of the read data to a first input/output pad in the normal mode and the second test mode;
a first data input circuit obtaining a corresponding part of the write data of the storage circuit via the first input/output pad in the normal mode, and obtaining output data of the first data output circuit via the first input/output pad in the second test mode;
a second data output circuit obtaining a corresponding part of the read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;
a comparison object selection circuit selecting the read data of the storage circuit in the first test mode, and selecting data including output data of the first data input circuit and output data of the second data input circuit in the second test mode;
a judging circuit performing a test judgment by comparing output data of the comparison object selection circuit with the expected value data and outputting a test result signal in the first test mode and the second test mode; and
a test result output circuit obtaining the test result signal and outputting the test result signal to an output pad in the first test mode and the second test mode.

15. A system comprising a semiconductor device, comprising:
a storage circuit performing data reading or data writing according to an external control signal in a normal mode, and performing data reading or data writing according to an internal control signal in a first test mode and a second test mode;
a self-test circuit generating the internal control signal, test data to be used as write data of the storage circuit and expected value data to be compared with read data of the storage circuit in the first test mode and the second test mode;
a first data output circuit obtaining a corresponding part of the read data of the storage circuit and outputting the corresponding part of the read data to a first input/output pad in the normal mode;
a first data input circuit obtaining a corresponding part of the write data of the storage circuit via the first input/output pad in the normal mode;
a second data output circuit obtaining a corresponding part of the read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;
a comparison object selection circuit selecting the read data of the storage circuit in the first test mode, and selecting data including the corresponding part in the first input/output pad of the read data of the storage circuit and output data of the second data input circuit in the second test mode;
a judging circuit performing a test judgment by comparing output data of the comparison object selection circuit with the expected value data and outputting a test result signal in the first test mode and the second test mode; and
a test result output circuit obtaining the test result signal and outputting the test result signal to an output pad in the first test mode and the second test mode.

16. A system comprising a semiconductor device, comprising:
a storage circuit performing data reading or data writing according to an external control signal in a normal mode, a first test mode and a second test mode;
a first data output circuit obtaining a corresponding part of read data of the storage circuit and outputting the corresponding part of the read data to a first input/output pad in the normal mode and the second test mode;
a first data input circuit obtaining a corresponding part of write data of the storage circuit via the first input/output pad in the normal mode, obtaining compressed data corresponding to the write data of the storage circuit via the first input/output pad in the first test mode and the second test mode, and obtaining output data of the first data output circuit via the first input/output pad in the second test mode;
a second data output circuit obtaining a corresponding part of the read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;
a compression object selection circuit selecting the read data of the storage circuit in the first test mode, and selecting data including output data of the first data input circuit and output data of the second data input circuit in the second test mode;
a data compression circuit compressing output data of the compression object selection circuit in the first test mode and the second test mode; and
a compression result output circuit obtaining output data of the data compression circuit and outputting the output data to an output pad in the first test mode and the second test mode.

17. A system comprising a semiconductor device, comprising:
a storage circuit performing data reading or data writing according to an external control signal in a normal mode, a first test mode and a second test mode;
a first data output circuit obtaining input data and outputting the input data to a first input/output pad in the normal mode, the first test mode and the second test mode;
a first data input circuit obtaining a corresponding part of write data of the storage circuit via the first input/output pad in the normal mode, and obtaining compressed data corresponding to the write data of the storage circuit via the first input/output pad in the first test mode and the second test mode;
a second data output circuit obtaining a corresponding part of read data of the storage circuit and outputting the corresponding part of the read data to a second input/output pad in the normal mode and the second test mode;
a second data input circuit obtaining a corresponding part of the write data of the storage circuit via the second input/output pad in the normal mode, and obtaining output data of the second data output circuit via the second input/output pad in the second test mode;

a compression object selection circuit selecting the read data of the storage circuit in the first test mode, and selecting data including the corresponding part in the first input/output pad of the read data of the storage circuit and output data of the second data output circuit in the second test mode;

a data compression circuit compressing output data of the compression object selection circuit in the first test mode and the second test mode; and an output object selection circuit selecting the corresponding part in the first input/output pad of the read data of the storage circuit as the input data of the first data output circuit in the normal mode, and selecting output data of the data compression circuit as the input data of the first data output circuit in the first test mode and the second test mode.

18. A system comprising a semiconductor device, comprising:

a storage circuit performing data reading or data writing according to an external control signal in a normal mode, and performing data reading or data writing according to an internal control signal in a first test mode and a second test mode;

a self-test circuit generating the internal control signal, test data to be used as write data of the storage circuit and expected value data to be compared with read data of the storage circuit in the first test mode and the second test mode;

a first data selection circuit selecting a corresponding part of the read data of the storage circuit in the normal mode, and selecting a corresponding part of the test data in the second test mode;

a first data output circuit obtaining output data of the first data selection circuit and outputting the output data to a first input/output pad in the normal mode and the second test mode;

a first data input circuit obtaining a corresponding part of the write data of the storage circuit via the first input/output pad in the normal mode, and obtaining output data of the first data output circuit via the first input/output pad as the corresponding part of the write data of the storage circuit in the second test mode;

a second data selection circuit selecting a corresponding part of the read data of the storage circuit in the normal mode, and selecting a corresponding part of the test data in the second test mode;

a second data output circuit obtaining output data of the second data selection circuit and outputting the output data to a second input/output pad in the normal mode and the second test mode;

a second data input circuit obtaining a corresponding part of the write data of the storage circuit via the second input/output pad in the normal mode, and obtaining output data of the second data output circuit via the second input/output pad as the corresponding part of the write data of the storage circuit in the second test mode;

a judging circuit performing a test judgment by comparing the read data of the storage circuit with the expected value data and outputting a test result signal in the first test mode and the second test mode; and a test result output circuit obtaining the test result signal and outputting the test result signal to an output pad in the first test mode and the second test mode.

* * * * *